United States Patent
Haneda et al.

(10) Patent No.: US 8,653,998 B2
(45) Date of Patent: Feb. 18, 2014

(54) D/A CONVERSION CIRCUIT, A/D CONVERSION CIRCUIT AND ELECTRONIC APPARATUS

(75) Inventors: Hideo Haneda, Matsumoto (JP); Takemi Yonezawa, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 85 days.

(21) Appl. No.: 13/401,485

(22) Filed: Feb. 21, 2012

(65) Prior Publication Data

US 2012/0212357 A1    Aug. 23, 2012

(30) Foreign Application Priority Data

Feb. 22, 2011   (JP) .................................. 2011-036019

(51) Int. Cl.
*H03M 1/66*    (2006.01)

(52) U.S. Cl.
USPC ......................................... 341/144; 341/150

(58) Field of Classification Search
USPC .................. 341/155, 144, 145, 150
See application file for complete search history.

(56) References Cited

U.S. PATENT DOCUMENTS

| 4,412,208 | A | * | 10/1983 | Akazawa et al. | 341/145 |
| 5,426,431 | A | * | 6/1995 | Ryu | 341/158 |
| 5,870,052 | A | | 2/1999 | Dedic et al. | |
| 6,154,162 | A | * | 11/2000 | Watson et al. | 341/150 |
| 6,600,437 | B1 | * | 7/2003 | Confalonieri et al. | 341/150 |
| 2010/0283645 | A1 | | 11/2010 | Haneda | |

FOREIGN PATENT DOCUMENTS

| JP | A-08-321779 | 12/1996 |
| JP | A-2010-263399 | 11/2010 |

* cited by examiner

*Primary Examiner* — Brian Young
(74) *Attorney, Agent, or Firm* — Oliff PLC

(57) ABSTRACT

A D/A conversion circuit includes a first D/A converting section which is connected with an output node, a first serial capacitor which is disposed between the output node and a first node, a second D/A converting section which is connected with the first node, and a control circuit. The first D/A converting section includes a first capacitor array section and a first switch array section. The second D/A converting section includes a second capacitor array section and a second switch array section. The control circuit performs a switch control for dynamically changing allocation of the capacitors to the respective bits of input digital data for the first switch array section of the first D/A converting section.

18 Claims, 22 Drawing Sheets

| bit | 5 | 6 | 7 | 8 | 9 | 10 |
|-----|---|---|---|---|---|----|
| 1C  | 1 | 2 | 4 | 2 | 4 | 2  |
| 3C  | 0 | 0 | 0 | 2 | 4 | 10 |

FIG. 9A

| bit | 5 | 6 | 7 | 8 | 9 | 10 |
|-----|---|---|---|---|---|----|
| 1C  | 1 | 2 | 4 | 2 | 4 | 2  |
| 6C  | 0 | 0 | 0 | 1 | 2 | 5  |

| COUNT VALUE CTX | DX1 | DX2 | DX3 | DX4 | DX5 | DX6 | DX7 | DX8 | DX9 | DX10 | DX11 | DX12 | DX13 | DX14 | DX15 |
|---|---|---|---|---|---|---|---|---|---|---|---|---|---|---|---|
| 0 | 5 | 6 | 6 | 7 | 7 | 7 | 7 | 8 | 8 | 9 | 9 | 9 | 9 | 10 | 10 |
| 1 | 6 | 6 | 7 | 7 | 7 | 7 | 8 | 8 | 9 | 9 | 9 | 9 | 10 | 10 | 5 |
| 2 | 6 | 7 | 7 | 7 | 7 | 8 | 8 | 9 | 9 | 9 | 9 | 10 | 10 | 5 | 6 |
| 3 | 7 | 7 | 7 | 7 | 8 | 8 | 9 | 9 | 9 | 9 | 10 | 10 | 5 | 6 | 7 |
| ... | ... | ... | ... | ... | ... | ... | ... | ... | ... | ... | ... | ... | ... | ... | ... |
| 14 | 10 | 5 | 6 | 6 | 7 | 7 | 7 | 7 | 8 | 8 | 9 | 9 | 9 | 9 | 10 |

FIG. 10B

| COUNT VALUE CTY | DY1 | DY2 | DY3 | DY4 | DY5 | DY6 | DY7 | DY8 | DY9 | DY10 | DY11 | DY12 | DY13 | DY14 | DY15 | DY16 |
|---|---|---|---|---|---|---|---|---|---|---|---|---|---|---|---|---|
| 0 | 8 | 8 | 9 | 9 | 9 | 9 | 10 | 10 | 10 | 10 | 10 | 10 | 10 | 10 | 10 | 10 |
| 1 | 8 | 9 | 9 | 9 | 9 | 10 | 10 | 10 | 10 | 10 | 10 | 10 | 10 | 10 | 10 | 8 |
| 2 | 9 | 9 | 9 | 9 | 10 | 10 | 10 | 10 | 10 | 10 | 10 | 10 | 10 | 10 | 8 | 8 |
| 3 | 9 | 9 | 9 | 10 | 10 | 10 | 10 | 10 | 10 | 10 | 10 | 10 | 10 | 8 | 8 | 9 |
| ... | ... | ... | ... | ... | ... | ... | ... | ... | ... | ... | ... | ... | ... | ... | ... | ... |
| 15 | 10 | 8 | 8 | 9 | 9 | 9 | 9 | 10 | 10 | 10 | 10 | 10 | 10 | 10 | 10 | 10 |

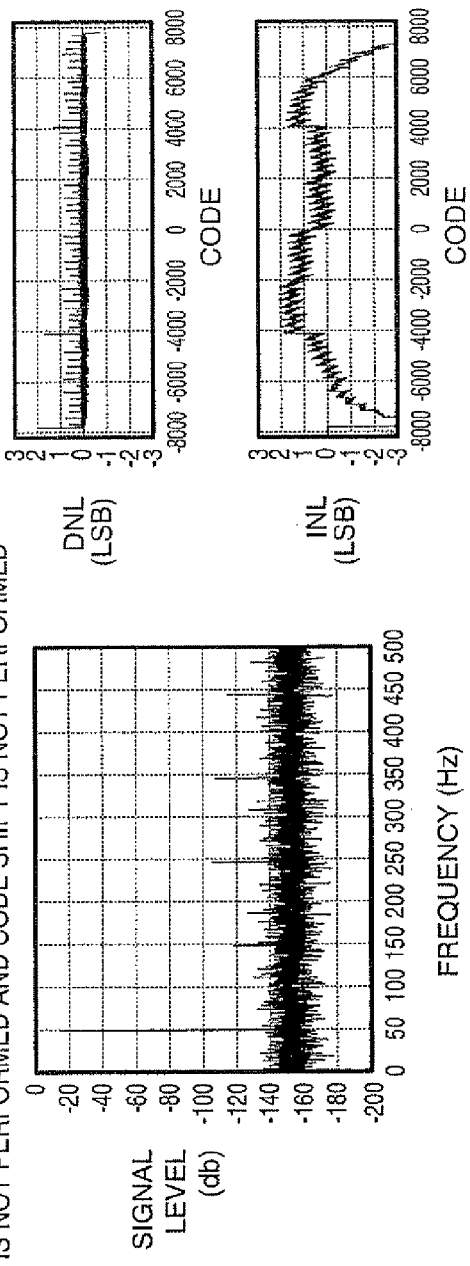
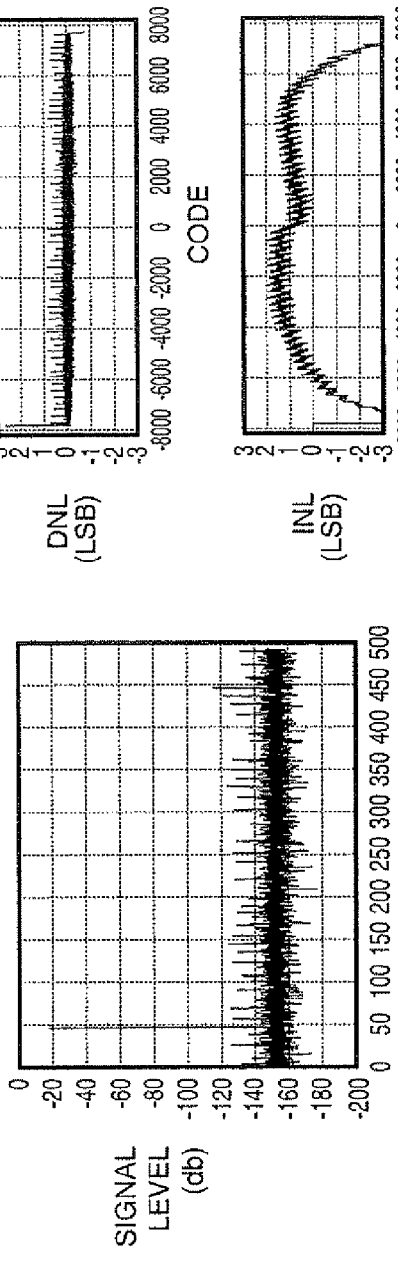
FIG. 16A  DEM IS NOT PERFORMED AND CODE SHIFT IS NOT PERFORMED
FIG. 16B  DEM IS PERFORMED AND CODE SHIFT IS NOT PERFORMED

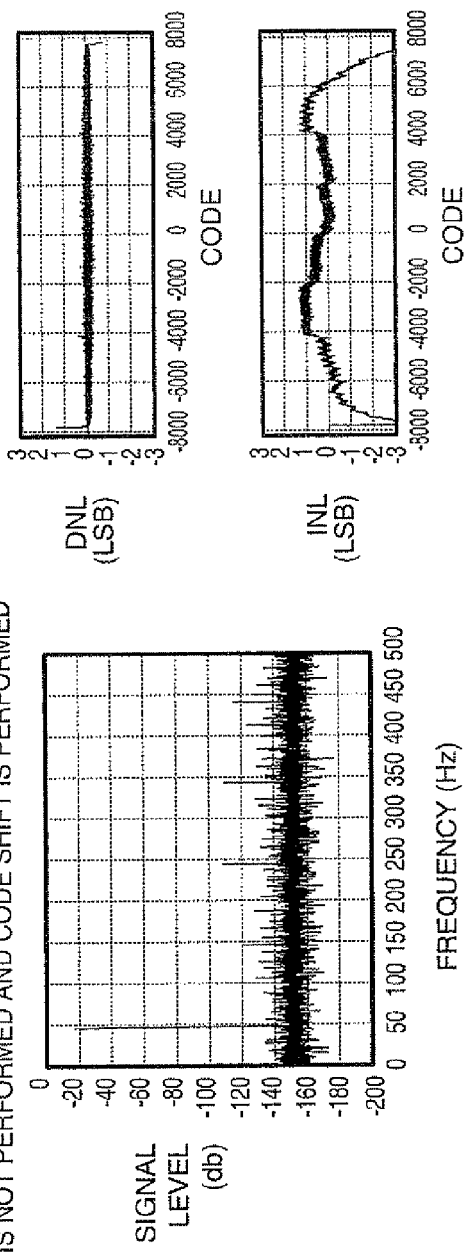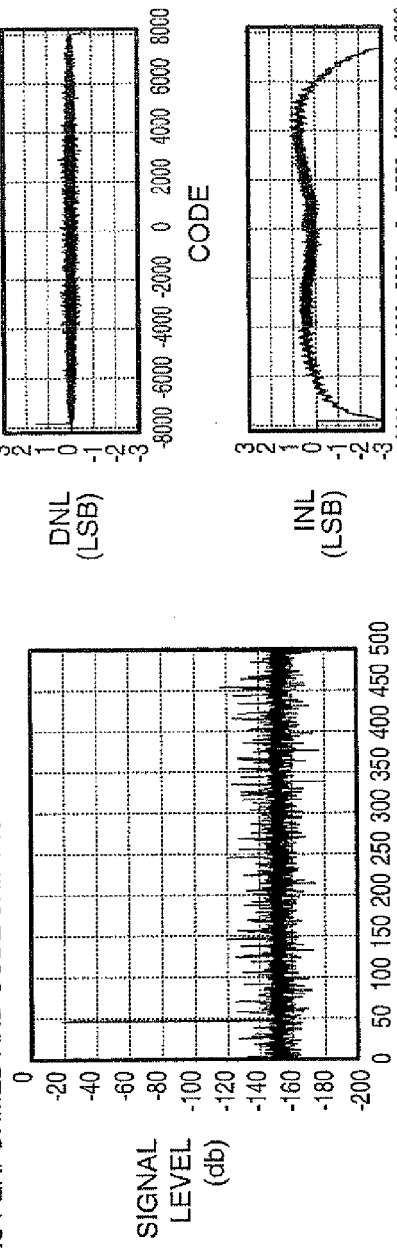
FIG. 17A  DEM IS NOT PERFORMED AND CODE SHIFT IS PERFORMED
FIG. 17B  DEM IS PERFORMED AND CODE SHIFT IS PERFORMED

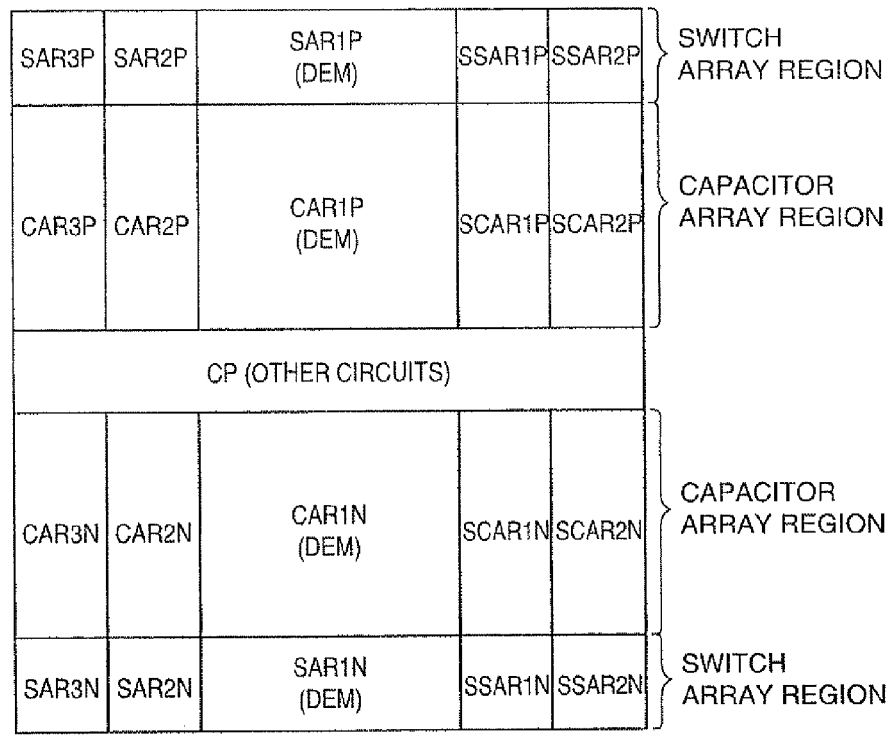
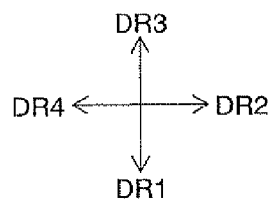
FIG. 22
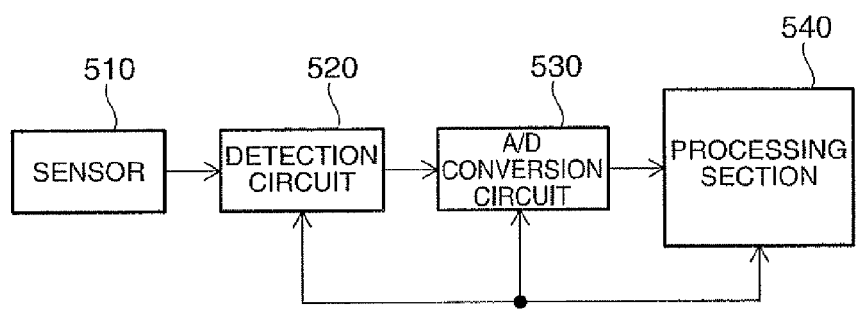
FIG. 23

D/A CONVERSION CIRCUIT, A/D CONVERSION CIRCUIT AND ELECTRONIC APPARATUS

BACKGROUND

1. Technical Field

The present invention relates to a D/A conversion circuit, an A/D conversion circuit, an electronic apparatus, and the like.

2. Related Art

In the related art, as an A/D conversion circuit for converting an analog signal into digital data, a successive approximation type A/D conversion circuit has been proposed. The successive approximation type A/D conversion circuit is provided with a comparison circuit, a successive approximation register, and a D/A conversion circuit, and performs A/D conversion by sampling (performing a sample and hold operation for) an input signal and a successive approximation operation to output digital data. As such a successive approximation type A/D conversion circuit in the related art, a technique disclosed in JP-A-8-321779 is known.

In such a successive approximation type A/D conversion circuit, most of the conversion accuracy depends on the accuracy of the D/A conversion circuit, the accuracy of the D/A conversion circuit directly affects the conversion accuracy of the A/D conversion circuit. Thus, in order to enhance the conversion accuracy of the A/D conversion circuit, it is important to realize a D/A conversion circuit of high conversion accuracy somehow or other.

However, in a case where the D/A conversion circuit is realized as a semiconductor IC, device variation occurs due to fluctuation in the manufacturing process or the like, and the conversion accuracy of the D/A conversion circuit is reduced due to the device variation. For example, in a charge redistribution type D/A conversion circuit, if the capacitance ratio accuracy is reduced due to the device variation of a capacitor, the conversion accuracy of the D/A conversion circuit is reduced. On the other hand, for example, if the layout area of the capacitor is enlarged in order to enhance the capacitance ratio accuracy, there arises a problem that the circuit becomes large-scaled.

SUMMARY

An advantage of some aspects of the invention is to provide a D/A conversion circuit, an A/D conversion circuit including the same and an electronic apparatus which are capable of enhancing apparent capacitance ratio accuracy to enhance conversion accuracy.

An aspect of the invention is directed to a D/A conversion circuit including: a first D/A converting section which is connected with an output node; a first serial capacitor which is disposed between the output node and a first node; a second D/A converting section which is connected with the first node; and a control circuit which performs a switch control, wherein the first D/A converting section includes a first capacitor array section including a plurality of capacitors of which each one end is connected with the output node, and a first switch array section including a plurality of switch elements which are connected with the other ends of the plurality of capacitors of the first capacitor array section and is switch-controlled according to higher bits of input digital data, wherein the second D/A converting section includes a second capacitor array section including a plurality of capacitors of which each one end is connected with the first node, and a second switch array section including a plurality of switch elements which is connected with the other ends of the plurality of capacitors of the second capacitor array section and is switch-controlled according to lower bits of the input digital data, and wherein the control circuit performs the switch control for dynamically changing allocation of the capacitors to the respective bits of the input digital data, for the first switch array section of the first D/A converting section.

According to the aspect of the invention, the first D/A converting section including the first capacitor array section and the first switch array section and the second D/A converting section including the second capacitor array section and the second switch array section are provided. Further, the first serial capacitor is disposed between the output node with which the first D/A conversion circuit is connected and the first node with which the second D/A conversion circuit is connected. Further, the switch control for dynamically changing the allocation of the capacitors to the respective bits of the input digital data is performed for the first switch array section of the first D/A converting section. According to this configuration, the switch control for dynamically changing the allocation of the capacitors to the respective bits of the input digital data is performed for the first switch array section of the first D/A converting section on the side of higher bits of the input digital data in which high capacitance ratio accuracy is required. Thus, it is possible to enhance apparent capacitance ratio accuracy of the capacitors in the first capacitor array section in which high capacitance ratio accuracy is required, and to enhance conversion accuracy.

Further, in the aspect of the invention, the D/A conversion circuit may further include: a second serial capacitor which is disposed between the output node and a second node; and a first sub-D/A converting section which is connected with the second node, and the first sub-D/A converting section may include a first sub-D/A capacitor array section including a plurality of capacitors of which each one end is connected with the second node, and a first sub-D/A switch array section including a plurality of switch elements which are connected with the other ends of the plurality of capacitors of the first sub-D/A capacitor array section.

With this first sub-D/A converting section, it is possible to realize, for example, a process for enhancing the conversion accuracy of the main first and second D/A converting sections, using the first sub-D/A converting section.

Further, in the aspect of the invention, when a direction which directs to the first switch array section from the first capacitor array section is represented as a first direction and a direction which is perpendicular to the first direction is represented as a second direction, the second capacitor array section of the second D/A converting section, the first capacitor array section of the first D/A converting section and the first sub-D/A capacitor array section of the first sub-D/A converting section may be disposed along the second direction in the order of the second capacitor array section, the first capacitor array section and the first sub-D/A capacitor array section.

With this configuration, in the D/A conversion circuit including the first and second D/A converting sections and the first sub-D/A converting section, it is possible to arrange their capacitor array sections and switch array sections with an efficient layout, thereby reducing the layout area, for example.

Further, in the aspect of the invention, the D/A conversion circuit may further include: a third serial capacitor which is disposed between the first node and a third node; a third D/A converting section which is connected with the third node; a fourth serial capacitor which is disposed between the second node and a fourth node; and a second sub-D/A converting section which is connected with the fourth node, the third D/A converting section may include a third capacitor array section including a plurality of capacitors of which each one end is connected with the third node, and a third switch array section including a plurality of switch elements which are connected with the other ends of the plurality of capacitors of the third capacitor array section, and the second sub-D/A converting section may include a second sub-D/A capacitor array section including a plurality of capacitors of which each one end is connected with the fourth node, and a second sub-D/A switch array section including a plurality of switch elements which are connected with the other ends of the plurality of capacitors of the second sub-D/A capacitor array section.

With this second sub-D/A converting section, it is possible to realize, for example, a correction process for enhancing the conversion accuracy of the main first and second D/A converting sections, using the second sub-D/A converting section.

Further, in the aspect of the invention, the second capacitor array section of the second D/A converting section may be disposed between the third capacitor array section of the third D/A converting section and the first capacitor array section of the first D/A converting section, and the first sub-D/A capacitor array section of the first sub-D/A converting section may be disposed between the first capacitor array section of the first D/A converting section and the second sub-D/A capacitor array section of the second sub-D/A converting section.

With this configuration, in the D/A conversion circuit including the first and second D/A converting sections and the first and second sub-D/A converting sections, it is possible to arrange their capacitor array sections and switch array sections with an efficient layout, thereby reducing the layout area, for example.

Further, in the aspect of the invention, the first capacitor array section may include a first type capacitor and a second type capacitor which is different in capacitance value from the first type capacitor as a plurality of capacitors, and the control circuit may perform the switch control for dynamically changing allocation of the first type capacitor and the second type capacitor to the respective bits of the input digital data, for the first switch array section.

With this configuration, by combination of the first type capacitor and the second type capacitor, it is possible to increase the number of allocation patterns and to enhance apparent capacitance ratio accuracy of the capacitors in the first capacitor array section. Accordingly, it is possible to enhance conversion accuracy. Further, for example, it is possible to reduce the layout area of the switch array section, compared with a case where the first capacitor array section includes only one of the first type capacitor and the second type capacitor, for example.

Further, in the aspect of the invention, the control circuit may include: a first counter; a second counter; a first allocation determination circuit which determines allocation of the first type capacitor to each bit of the input digital data on the basis of a first count value from the first counter; and a second allocation determination circuit which determines allocation of the second type capacitor to each bit of the input digital data on the basis of a second count value from the second counter.

With this configuration, it is possible to dynamically change the allocation of the first type capacitor and the second type capacitor to the respective bits of the input digital data, with allocation patterns of which the number is determined by the first count value and the second count value.

Further, in the aspect of the invention, the first type capacitor may include M unit capacitors, and the second type capacitor may include N (integer which is different from M) unit capacitors.

With this configuration of the first type capacitor and the second type capacitor having the unit capacitors, it is possible to realize the first type capacitor and the second type capacitor having different capacitance values while maintaining the capacitance ratio accuracy.

Further, in the aspect of the invention, the plurality of unit capacitors which form the first type capacitor and the second type capacitor may be disposed in a matrix form, the row arrangement position of the unit capacitor which forms the first type capacitor in an i-th (i is a natural number) column in the matrix-formed arrangement may be different from the row arrangement position of the unit capacitor which forms the first type capacitor in an (i+1)-th column in the matrix-formed arrangement, and the row arrangement position of the unit capacitor which forms the second type capacitor in the i-th column in the matrix-formed arrangement may be different from the row arrangement position of the unit capacitor which forms the second type capacitor in the (i+1)-th column in the matrix-formed arrangement.

With this configuration, by dispersing and arranging the unit capacitors which form the first type capacitor and the second type capacitor to have a layout of the matrix form, it is possible to reduce the influence of position dependency of variation in a capacitance value, for example.

Further, in the aspect of the invention, the first capacitor array section may include a first non-inverting capacitor array section including a plurality of capacitors of which each one end is connected with the output node on a non-inverting side and a first inverting capacitor array section including a plurality of capacitors of which each one end is connected with the output node on an inverting side, the first switch array section may include a first non-inverting switch array section including a plurality of switch elements which are connected with the other ends of the plurality of capacitors of the first non-inverting capacitor array section and is switch-controlled according to the higher bits of the input digital data and a first inverting switch array section including a plurality of switch elements which are connected with the other ends of the plurality of capacitors of the first inverting capacitor array section and are switch-controlled according to the higher bits of the input digital data, the second capacitor array section may include a second non-inverting capacitor array section including a plurality of capacitors of which each one end is connected with the first node on the non-inverting side and a second inverting capacitor array section including a plurality of capacitors of which each one end is connected with the first node on the inverting side, and the second switch array section may include a second non-inverting switch array section including a plurality of switch elements which are connected with the other ends of the plurality of capacitors of the second non-inverting capacitor array section and are switch-controlled according to the lower bits of the input digital data and a second inverting switch array section including a plurality of switch elements which are connected with the other ends of the plurality of capacitors of the second inverting capacitor array section and are switch-controlled according to the lower bits of the input digital data.

With this configuration, in a full differential D/A conversion circuit, it is possible to realize the switch control for dynamically changing the allocation of the first type capacitor and the second type capacitor to the respective bits of the input digital data.

Another aspect of the invention is directed to an A/D conversion circuit including: any one of the D/A conversion circuits as described above; and a comparison circuit which performs a comparison process for a signal of the output node of the D/A conversion circuit and a sampled signal of an input signal.

Still another aspect of the invention is directed to an electronic apparatus including any one of the D/A conversion circuits as described above.

Yet another aspect of the invention is directed to an electronic apparatus including any one of the A/D conversion circuits as described above.

BRIEF DESCRIPTION OF THE DRAWINGS

The invention will be described with reference to the accompanying drawings, wherein like numbers reference like elements.

FIGS. 9A and 9B are diagrams illustrating a method of allocating a capacitor to each bit of input digital data.

FIGS. 10A and 10B are diagram illustrating a method of allocating a capacitor to each bit of input digital data.

FIGS. 16A and 16B are diagrams illustrating examples of FFT and DNL/INL characteristics in a case where DEM or code shift is performed or is not performed.

FIGS. 17A and 17B are diagrams illustrating examples of FFT and DNL/INL characteristics in a case where DEM or code shift is performed or is not performed.

FIG. 22 is a diagram illustrating an example of layout arrangement of a capacitor array region and a switch array region in a case where the full differential D/A conversion circuit is used in the third configuration example.

FIG. 23 is a diagram illustrating a configuration of an electric apparatus according to an embodiment of the invention.

DESCRIPTION OF EXEMPLARY EMBODIMENTS

Hereinafter, preferred embodiments of the invention will be described in detail. It should be noted that the present embodiments described below do not unreasonably limit the content of the invention as set forth in the claims, and all of the configurations set forth in the present embodiments are not necessarily essential as means for solving the problems of the invention.

1. Configuration

Figure 1:
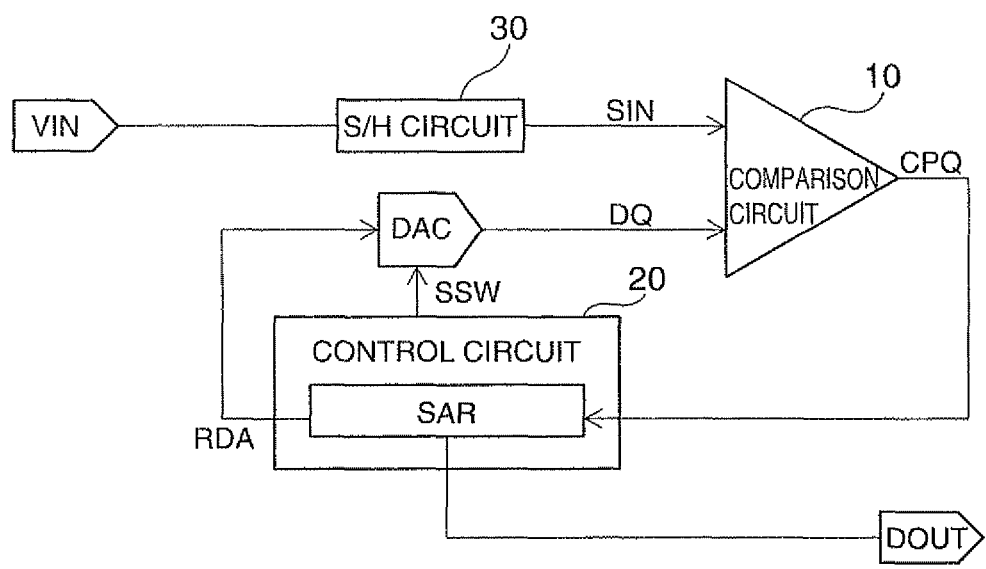
FIG. 1 is a diagram illustrating a configuration example of an A/D conversion circuit in which a D/A conversion circuit is used, according to an embodiment of the invention.

FIG. 1 shows a configuration example of an A/D conversion circuit in which a D/A conversion circuit is used according to an embodiment of the invention. The A/D conversion circuit includes a D/A conversion circuit DAC, a comparison circuit 10, and a control circuit 20. Further, the A/D conversion circuit may include an S/H (sample and hold) circuit 30.

Hereinafter, an example in which the D/A conversion circuit of the present embodiment is applied to a successive approximation type A/D conversion circuit is described, but the present embodiment is not limited thereto. For example, a variety of modifications are available such that the D/A conversion circuit of the present embodiment may be applied to an A/D conversion circuit having a different configuration from that in FIG. 1 or may be applied to a circuit (for example, programmable-gain amplification circuit or the like) other than the A/D conversion circuit. Further, in a case where the D/A conversion circuit of the present embodiment is applied to the successive approximation type A/D conversion circuit, the configuration of the A/D conversion circuit is not also limited to the configuration in FIG. 1, but a variety of modifications such as elimination of some components or addition of other components are possible.

The control circuit 20 has a successive approximation register (SAR) in which a register value is set by a comparison result signal CPQ from the comparison circuit 10 and outputs successive approximation data RDA (input digital data). The D/A conversion circuit DAC D/A-converts the successive approximation data RDA from the control circuit 20, and outputs a D/A conversion signal DQ corresponding to the successive approximation data RDA.

The comparison circuit 10 performs a comparison process of comparing a signal SIN with the signal DQ, for example, which is realized by a comparator (for example, latch type comparator).

The control circuit 20 has the successive approximation register SAR. Further, in a case where the comparison circuit 10 performs the successive approximation process from an MSB bit to an LSB bit, the comparison process result ("1" or "0") at each bit is stored as each register value of the successive approximation register SAR.

The control circuit 20 performs a control process of each circuit block of the A/D conversion circuit. For example, the control circuit 20 outputs a control signal SSW and performs a switch control (on or off control) of switch elements (switch array section) included in the D/A conversion circuit DAC.

The D/A conversion circuit DAC performs D/A conversion of the successive approximation data RDA from the control circuit 20. Further, the D/A conversion circuit DAC outputs the D/A output signal DQ (analog signal obtained by D/A-converting the RDA) corresponding to the successive approximation data RDA.

The S/H (sample and hold) circuit 30 is a circuit for sampling and holding an input signal VIN which is a target of the A/D conversion. In the present embodiment, since the D/A conversion circuit DAC of a charge redistribution type is used, the function of the S/H circuit 30 in FIG. 1 is actually realized by the D/A conversion circuit DAC.

Figure 2:
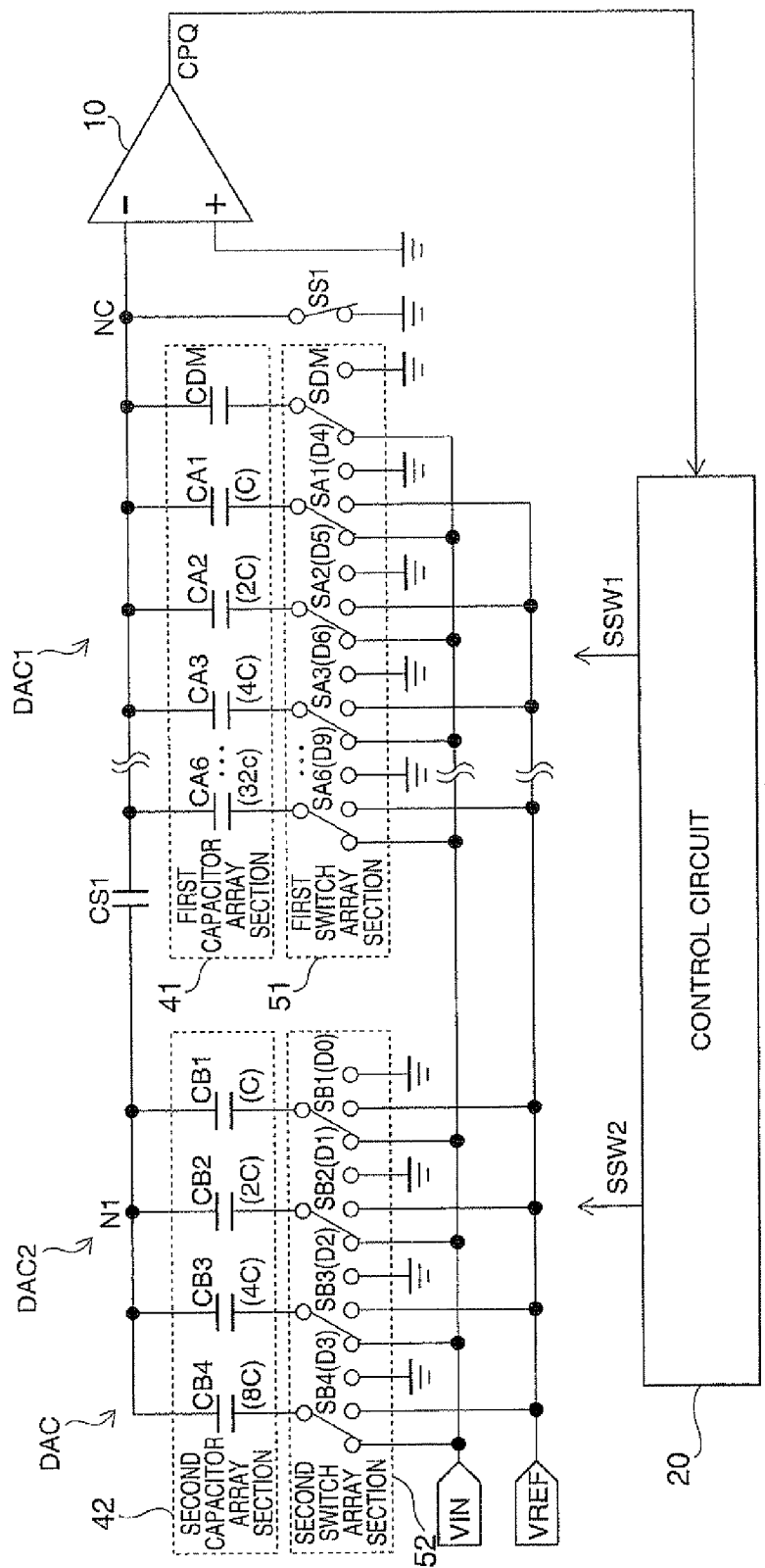
FIG. 2 is a diagram illustrating a first configuration example of a D/A conversion circuit and an A/D conversion circuit including the D/A conversion circuit.

FIG. 2 shows a detailed first configuration example of the D/A conversion circuit and the A/D conversion circuit including the D/A conversion circuit of the present embodiment. The D/A conversion circuit DAC in FIG. 2 includes a first D/A converting section DAC1, a first serial capacitor CS1, a second D/A converting section DAC2, and the control circuit 20 which performs the switch control. Further, the D/A conversion circuit DAC may include a switch element SS1 for setting a node NC to GND (AGND) in a sampling period. The first D/A converting section DAC1 is connected to the output node NC (comparison node). The serial capacitor CS1 is disposed between the output node NC and a first node N1. The second D/A converting section DAC2 is connected to the first node N1.

The first D/A converting section DAC1 includes a first capacitor array section 41 and a first switch array section 51. The first capacitor array section 41 has a plurality of capacitors CA1 to CA6 (CA1 to CAn in a broad sense) of which each one end is connected to the output node NC. These capacitors CA1 to CA6 are binary-weighted to be 1:2:4:8:16:32. Further, the first capacitor array section 41 includes a dummy capacitor CDM.

The first switch array section 51 has a plurality of switch elements SA1 to SA6 (SA1 to SAn in a broad sense) which are connected to the other ends of the plurality of capacitors CA1 to CA6 of the first capacitor array section 41. Further, the first switch array section 51 may include a switch element SDM for a dummy capacitor which is connected to the dummy capacitor CDM. The switch elements SA1 to SAG are switch-controlled according to higher bits (D4 to D9) of the input digital data of the DAC. That is, the switch elements SA1 to SAG are switch-controlled on the basis of a control signal SSW1 from the control circuit 20.

The second D/A converting section DAC2 includes a second capacitor array section 42 and a second switch array section 52. The second capacitor array section 42 has a plurality of capacitors CB1 to CB4 (CB1 to CBm in a broad sense) of which each one end is connected to the first node N1. These capacitors CB1 to CB4 are binary-weighted to be 1:2:4:8.

The second switch array section 52 has a plurality of switch elements SB1 to SB4 (SB1 to SBm in a broad sense) which are connected to the other ends of the plurality of capacitors CB1 to CB4 of the second capacitor array section 42. The switch elements SB1 to SB4 are switch-controlled according to lower bits (D0 to D3) of the input digital data of the DAC. That is, the switch elements SB1 to SB4 are switch-controlled on the basis of a control signal SSW2 from the control circuit 20.

The node NC (comparison node, sampling node) is a node to be connected to a first input terminal (inverting input terminal) of the comparison circuit 10, and a second input terminal (non-inverting input terminal) of the comparison circuit 10 is set to GND.

Further, in the present embodiment, the control circuit 20 performs the switch control of dynamically changing allocation of the capacitors to the respective bits (bit 5 to bit 10, D4 to D9) of the input digital data of the DAC, for the first switch array section 51. That is, the control circuit 20 performs the switch control of DEM (Dynamic Element Matching). By performing the above-described switch control of DEM, it is possible to provide randomness to a combination pattern of the capacitors of the first capacitor array section 41, and thus, to enhance the apparent capacitance ratio accuracy in the capacitor of the first capacitor array section 41.

In the A/D conversion circuit in FIG. 2, the switch element 8S1 is turned on in the sampling period, and the node NC is set to GND. Further, the other ends of the capacitors CA1 to CA6 and CB1 to CB4 are set to a voltage level of the input signal VIN through the switch elements SA1 to SA6 and SB1 to SB4.

According to this configuration, the sampling of the input signal VIN is performed. Further, if the switch element SS1 is turned off, the voltage of the input signal VIN at the timing is held. During the sampling period, the other end of the dummy capacitor CDM is set to the voltage level of the VIN through the switch element SDM for the dummy capacitor.

Next, if it becomes the successive approximation period of the A/D conversion, the other end of the dummy capacitor CDM is set to GND, and the switch elements SA1 to SA6 of the first switch array section 51 and the switch elements SB1 to SB4 of the second switch array section 52 are switch-controlled on the basis of the respective bits of the input digital data (successive approximation data), and the other ends of the capacitors CA1 to CA6 and CB1 to CB4 are set to VREF or GND.

For example, the resolution of DAC is set to p=m+n=4+6=10 bits. Then, in a case where the input digital data (successive approximation data) of p=10 bits is 1000000000, the other end of the capacitor CA6 corresponding to the MSB of the input digital data is set to the reference voltage VREF. Further, the other ends of the capacitors CA5 to CA1 and CB4 to CB1 are set to GND.

Further, in a case where the input digital data is 1000001000, the other ends of the capacitor CA6 corresponding to the MSB and the capacitor CB4 corresponding to bit 4 are set to VREF. Further, the other ends of the capacitors CA5 to CA1 and CB3 to CB1 are set to GND.

Further, during the successive approximation period, the successive approximation process is sequentially performed from the MSB which is the most significant bit. Specifically, the other ends of the capacitors CA1 to CA6 and CB1 to CB4 are switched to be connected to the reference voltage VREF or GND according to the input digital data of the DAC using the switch elements SA1 to SA6 and SB1 to SB4. The voltage of the node NC of the inverting input terminal of the comparison circuit 10 becomes a voltage obtained by subtracting the sampling voltage of the VIN from the output value of the DAC. Further, the comparison circuit 10 compares the voltage of the node NC with GND, and outputs the result to the control circuit 20 as a comparison result signal CPQ. Thus, the A/D conversion through the successive approximation is realized.

Figure 3:
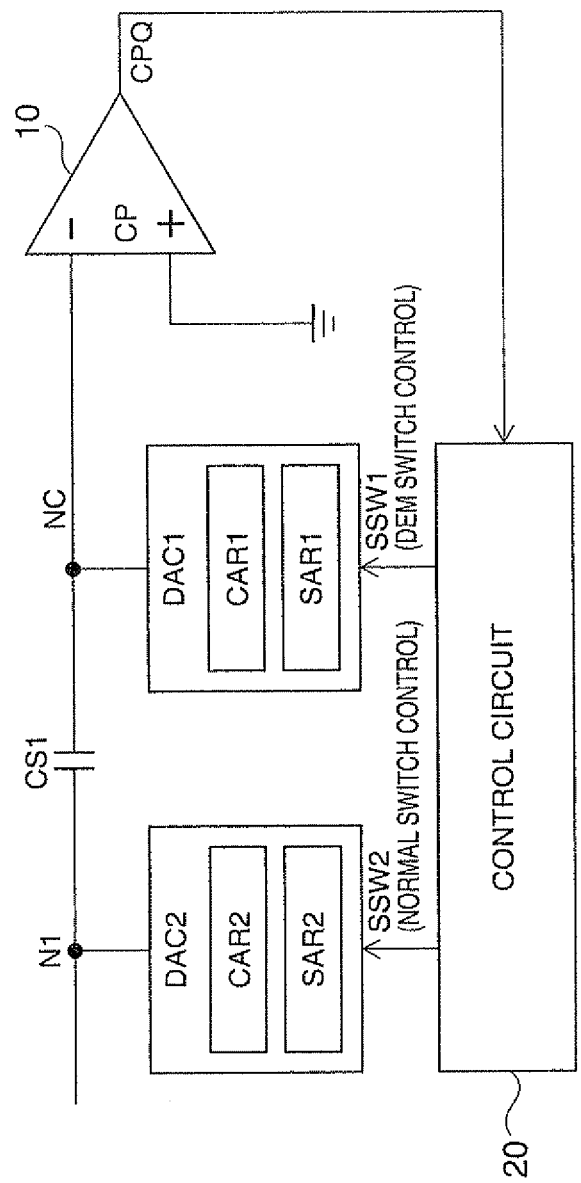
FIG. 3 is a diagram illustrating a method according to an embodiment of the invention.

Further, in the present embodiment, as shown in FIG. 3, the switch control of DEM is performed for the DAC1 on the higher bit side of the input digital data. Specifically, the switch control of DEM is performed for the DAC1 on the higher bit side of the input digital data on the basis of the control signal SSW1 from the control circuit 20. On the other hand, a normal switch control which is not the switch control of DEM is performed for the DAC2 on the lower bit side of the input digital data on the basis of the control signal SSW2 from the control circuit 20. In this way, it is possible to enhance the capacitance ratio accuracy while suppressing increase in the layout area of an IC, to thereby enhance the conversion accuracy.

For example, in the capacitive DAC having the configuration shown in FIGS. 2 and 3, high capacitance ratio accuracy is required on the higher bit side, compared with the lower bit side. That is, in the configuration in which the serial capacitor CS1 is formed as shown in FIG. 2, the capacitor CA1 of the DAC1 on the higher bit side and the capacitor CB1 of the DAC2 on the lower bit side are set to the same capacitance value, for example. Accordingly, variation in the capacitance ratio accuracy for the capacitor CA1 and variation in the capacitance ratio accuracy for the capacitor CB1 become equivalent. However, since the CA1 is a capacitor on the higher bit side, if the variation in, the capacitance ratio accuracy which is the same as that of the CB1 on the lower bit side occurs in the CA1, the conversion accuracy is noticeably reduced.

Here, in FIGS. 2 and 3, since the switch control of DEM is performed as the switch control for the capacitors CA1 to CA6 on the higher bit side, the apparent capacitance ratio accuracy for the capacitors CA1 to CA6 increases compared with the capacitors CB1 to CB4 on the lower bit side. Accordingly, it is possible to enhance the conversion accuracy while suppressing increase in the layout area of the IC.

In this case, as a method of a comparative example of the present embodiment, a method of performing the switch control of DEM for the DAC2 on the lower bit side in addition to the DAC1 on the higher bit side may be considered. However, as the method of the comparative example, it is necessary to provide a control circuit for the DEM control with respect to the DAC2 on the lower bit side. Further, in the capacitor array section 42 of the DAC2 on the lower bit side, it is necessary to provide a configuration or layout arrangement of capacitors for DEM (which will be described later). Thus, in the method of the comparative example, there is a problem that the size of the circuit becomes large or the process is complicated.

In this regard, as shown in FIGS. 2 and 3, in the present embodiment, since the switch control through DEM is performed only for the DAC1 on the higher bit side, it is possible to suppress the circuit from being increased in size or the process from being complicated, compared with the method of the comparative example.

2. Layout Arrangement

Figure 4:
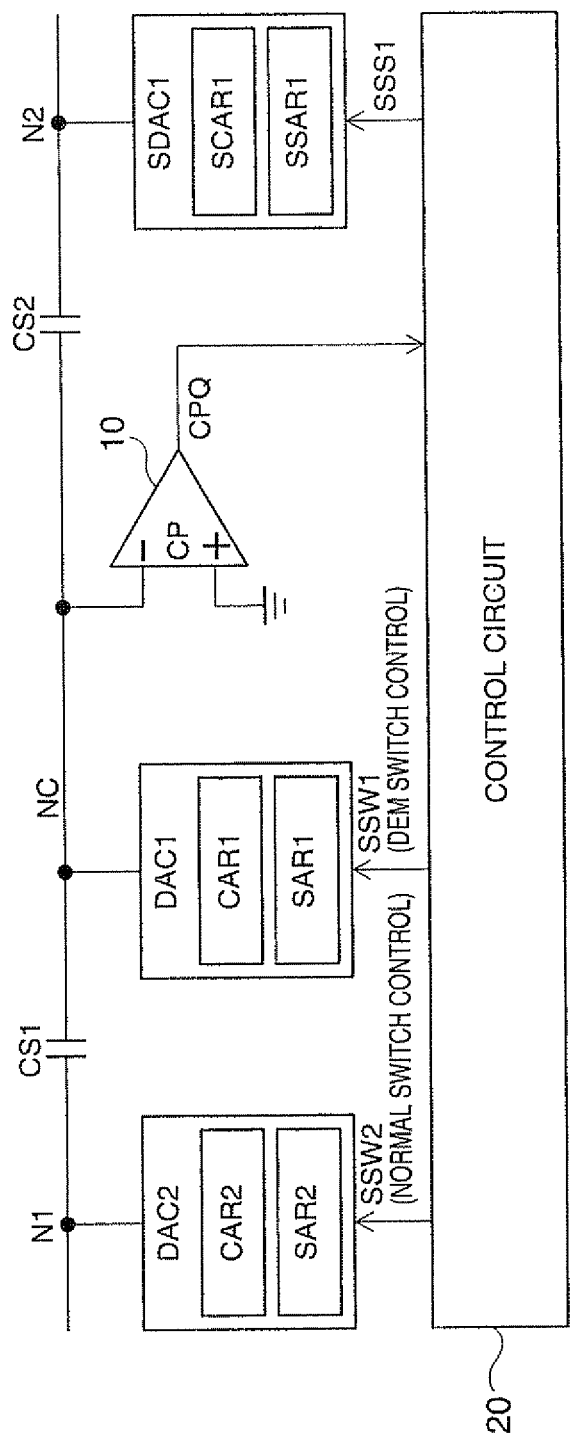
FIG. 4 is a diagram illustrating a second configuration example of a D/A conversion circuit and an A/D conversion circuit including the D/A conversion circuit.

Next, a layout arrangement method of the present embodiment will be described. Firstly, FIG. 4 shows a second configuration example of the D/A conversion circuit and the A/D conversion circuit including the D/A conversion circuit of the present embodiment. In the second configuration example in FIG. 4, components of a second serial capacitor CS2 and a first sub-D/A converting section SDAC1 are added to the first configuration example in FIGS. 2 and 3.

The first serial capacitor CS2 is disposed between the output node NC and a second node N2. The first sub-D/A converting section SDAC1 is connected to the second node N2.

As described with reference to FIGS. 2 and 3, the first D/A converting section DAC1 on the higher bit side includes a first capacitor array section CAR1 (41 in FIG. 2) and a first switch array section SAR1 (51 in FIG. 2). Further, the second D/A converting section DAC2 on the lower bit side includes a second capacitor array section CAR2 (42 in FIG. 2) and a second switch array section SAR2 (52 in FIG. 2).

On the other hand, the first sub-D/A converting section SDAC1 includes a first sub-D/A capacitor array section SCAR1 and a second sub-D/A switch array section SSAR1. The first sub-D/A capacitor array section SCAR1 includes a plurality of capacitors of which each one end is connected to the second node N2. The second sub-D/A switch array section SSAR1 includes a plurality of switch elements connected to the other ends of the plurality of capacitors of the first sub-D/A capacitor array section SCAR1.

The first sub-D/A converting section SDAC1 is used as a D/A converting section for code shift (which will be described later), for example. The first sub-D/A converting section SDAC1 may be used as a D/A converting section for serial capacitor trimming adjustment. Further, a detailed configuration of the second configuration example in FIG. 4 will be described later.

Figure 5:
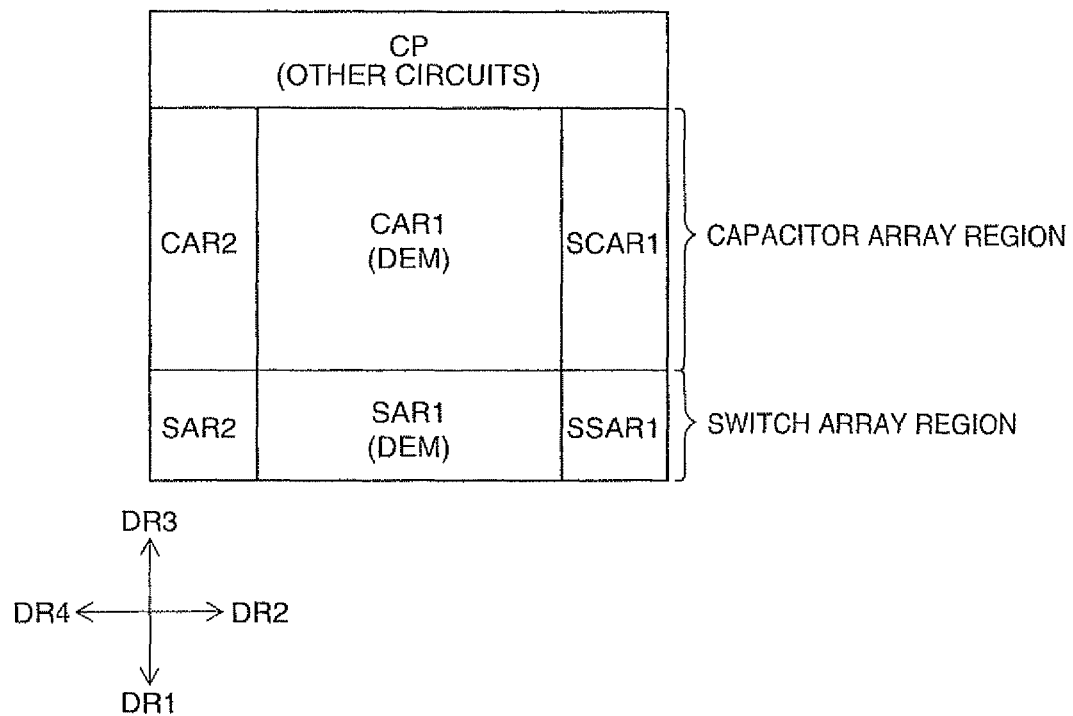
FIG. 5 is a diagram illustrating an example of layout arrangement of a capacitor array region and a switch array region in the second configuration example.

FIG. 5 shows a layout arrangement of a capacitor array region and a switch array region in the second configuration example in FIG. 4.

In FIG. 5, a direction from the first capacitor array section CAR1 to the first switch array section SAR1 in the first D/A converting section DAC1 in FIG. 4 is represented as a first direction DR1, and a direction which is perpendicular to the first direction DR1 is represented as a second direction DR2. Further, a direction which is opposite to the first direction DR1 is represented as a third direction DR3, and a direction which is opposite to the second direction DR2 is represented as a fourth direction DR4. The first direction DR1 is a direction from the central position (center point) of the CAR1 to the central position of the SAR1, for example.

In this case, in FIG. 5, the second capacitor array section CAR2 of the second D/A converting section DAC2, the first capacitor array section CAR1 of the first D/A converting section DAC1 and the first sub-D/A capacitor array section SCAR1 of the first sub-D/A converting section SDAC1 are arranged along the second direction DR2. Specifically, the second capacitor array section CAR2, the first capacitor array section CAR1 and the first sub-D/A capacitor array section SCAR1 are sequentially arranged along the second direction DR2. That is, the CAR1 is arranged between the CAR2 and the SCAR1. Further, the CAR1 and the CAR2 are arranged to be adjacent to each other, and the CAR1 and the SCAR1 are also arranged to be adjacent to each other.

Further, the first switch array section SAR1 is arranged in the first direction DR1 of the first capacitor array section CAR1. Similarly, the SAR2 is arranged in the first direction DR1 of the CAR2, and the SSAR1 is arranged in the first direction DR1 of the SCAR1. The comparison circuit CP or the other circuits are arranged in the third direction DR3 of the first capacitor array section CAR1.

According to the layout arrangement in FIG. 5, it is possible to efficiently perform the layout arrangement of the capacitor array section or the switch array section of the DAC, to thereby reduce the layout area of the DAC. That is, it is possible to realize the layout arrangement of the capacitor array section and the switch array section which is optimal for the circuits which are symmetrically disposed around the node NC, as shown in FIG. 4, and thus, it is possible to enhance the layout efficiency and to reduce the circuit area.

Further, according to the layout arrangement in FIG. 5, for example, it is possible to efficiently wire signal lines to the capacitor array section CAR1 from the switch array section SAR1, and thus, it is possible to reduce the influence of the wiring area of the signal lines to increase in the layout area. Similarly, it is possible to efficiently wire the signal lines to the capacitor array section CAR2 from the switch array section SAR2, or the signal lines to the capacitor array section SCAR1 from the switch array section SSAR1, to thereby reduce the layout area.

Further, as described with reference to FIG. 3, high capacitance ratio accuracy is required in the capacitor array section CAR1 of the DAC1 on the higher bit side, compared with the DAC2 on the lower bit side.

In this regard, in the layout arrangement in FIG. 5, the capacitor array section CAR1 on the higher bit side in which high capacitance ratio accuracy is required is disposed between the capacitor array section CAR2 on the lower bit side in which low capacitance ratio accuracy is required and the capacitor array section SCAR1. Thus, different capacitors are layout-arranged around the capacitor array section CAR1, and thus, it is possible to suppress variation in the capacitance ratio accuracy of the capacitor array section CAR1 due to change in the manufacturing process. Accordingly, it is possible to satisfy the high capacitance ratio accuracy which is required in the capacitor array section CAR1 on the higher bit side, by design of the layout arrangement and the DEM control.

Figure 6:
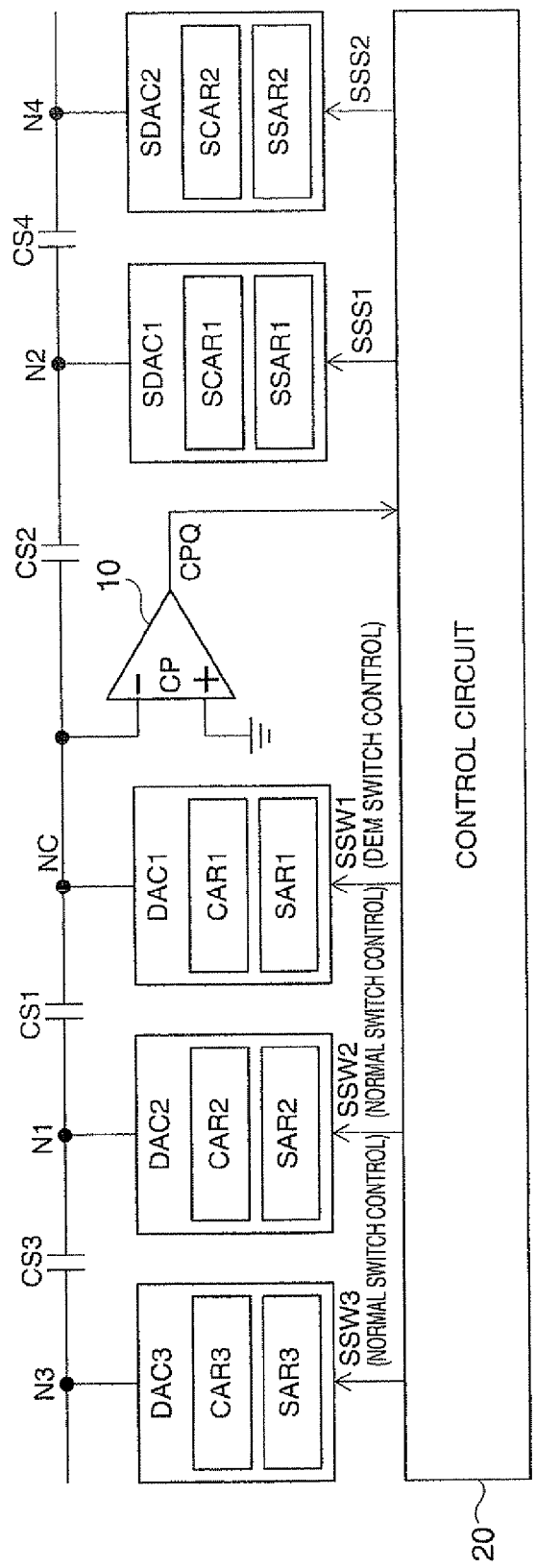
FIG. 6 is a diagram illustrating a third configuration example of a D/A conversion circuit and an A/D conversion circuit including the D/A conversion circuit.

FIG. 6 shows a third configuration example of the D/A conversion circuit and the A/D conversion circuit including the D/A conversion circuit according to the present embodiment. In the third configuration example in FIG. 6, components of a third serial capacitor CS3, a fourth serial capacitor CS4, a third D/A converting section DAC3, and a second sub-D/A converting section SDAC2 are added to the second configuration example in FIG. 4.

The third serial capacitor CS3 is disposed between the first node N1 and a third node N3. The fourth serial capacitor CS4 is disposed between the second node N2 and a fourth node N4. The third D/A converting section DAC3 is connected to the third node N3. The second sub-D/A converting section SDAC2 is connected to the fourth node N4.

The third D/A converting section DAC3 includes a third capacitor array section CAR3 and a third switch array section SAR3. The third capacitor array section CAR3 has a plurality of capacitors of which each one end is connected to the third node N3. The third switch array section SAR3 has a plurality of switch elements connected to the other ends of the plurality of capacitors of the third capacitor array section CAR3. The configurations of the third capacitor array section CAR3 and the third switch array section SAR3 are the same as the configurations of the second capacitor array section 42 (CAR2) and the second switch array section 52 (SAR2) in FIG. 2.

The second sub-D/A converting section SDAC2 includes a second sub-D/A capacitor array section SCAR2 and a second sub-D/A switch array section SSAR2. The second sub-D/A capacitor array section SCAR2 has a plurality of capacitors of which each one end connected to the fourth node N4. The second sub-D/A switch array section SSAR2 has a plurality of switch elements connected to the other ends of the plurality of capacitors of the second sub-D/A capacitor array section SCAR2. The configurations of the second sub-D/A capacitor array section SCAR2 and the second sub-D/A switch array section SSAR2 are the same as the configurations of the first sub-D/A capacitor array section SCAR1 and the first sub-D/A switch array section SSAR1 in the first sub-D/A converting section SDAC1.

In FIG. 6, the switch control of DEM is performed for the DAC1 on the higher bit side in which the high capacitance ratio accuracy is required, but the normal switch control which is not DEM is performed for the DAC2 and the DAC3 on the lower bit side thereof. For example, in a case where the resolution of the DAC is 14 bits, the DAC1 performs D/A conversion of higher bits 14 to 9 of the input digital data. On the other hand, the DAC2 performs D/A conversion of lower bits 8 to 5 of the input digital data, and DAC3 performs D/A conversion of further lower bits 4 to 1. A modified example may be made such that the normal switch control is performed for the DAC3, but the switch control of DEM is performed for the DAC2.

Further, the first sub-D/A converting section SDAC1 is used as, for example, the D/A converting section for code shift, as described above. On the other hand, the second sub-D/A converting section SDAC2 is used as the D/A converting section for serial capacitor trimming adjustment. That is, if parasitic capacitors are present in the nodes N1 and N3 in FIG. 6, DNL or INL of main DACs (DAC1, DAC2 and DAC3) are deteriorated. This phenomenon occurs because the capacitance ratio which is binary-weighted is significantly fluctuated by the parasitic capacitors of the node N1 and N3. If the linearity of the main DAC is deteriorated, the linearity of the A/D conversion circuit is also deteriorated and the conversion characteristics become non-linear. The second sub-D/A converting section SDAC2 corrects the non-linearity of the conversion characteristics between the input signal and the output data of the A/D conversion circuit. Specifically, the second sub-D/A converting section SDAC2 receives correction data for correcting the non-linearity of the conversion characteristics of the A/D conversion from the control circuit 20 and D/A-converts the correction data, to thereby correct the non-linearity of the conversion characteristics of the A/D conversion.

Figure 7:
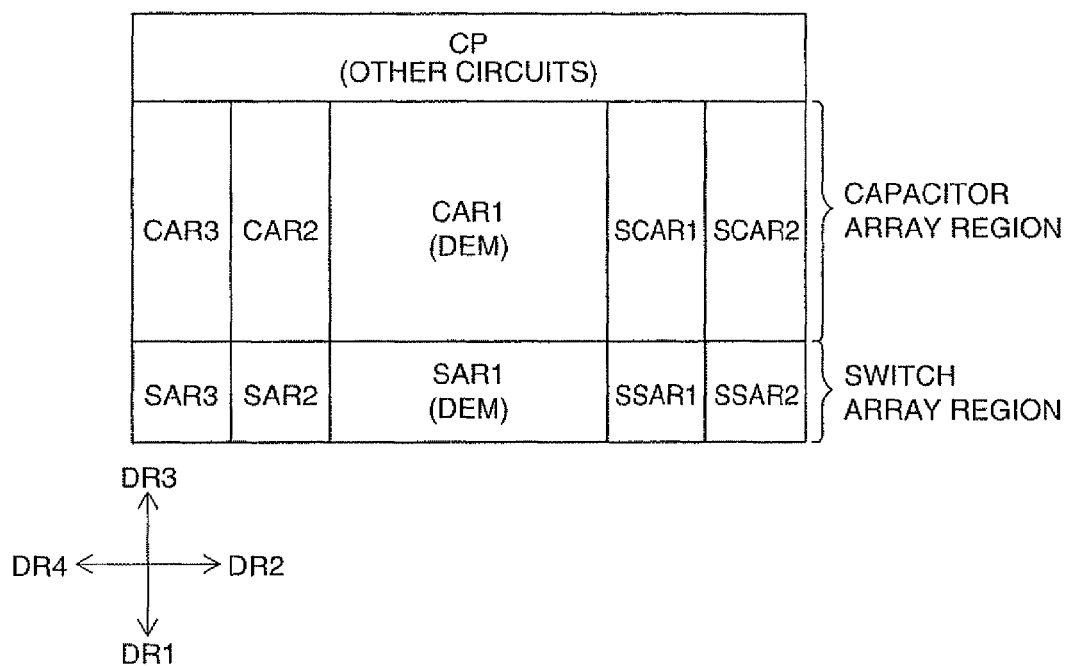
FIG. 7 is a diagram illustrating an example of layout arrangement of a capacitor array region and a switch array region in the third configuration example.

FIG. 7 shows a layout arrangement example of a capacitor array region and a switch array region in the third configuration example in FIG. 6.

As shown in FIG. 7, the second capacitor array section CAR2 of the second D/A converting section DAC2 is disposed between the third capacitor array section CAR3 of the third D/A converting section DAC3 and the first capacitor array section CAR1 of the first D/A converting section DAC1. For example, the CAR3, the CAR2 and the CAR1 are disposed in the order of the CAR3, the CAR2 and the CAR1 along the second direction DR2. Specifically, the CAR3 and the CAR2 are disposed to be adjacent to each other, and the CAR2 and the CAR1 are also disposed to be adjacent to each other.

Further, the first sub-D/A capacitor array section SCAR1 of the first sub-D/A converting section SDAC1 is disposed between the first capacitor array section CAR1 of the first D/A converting section DAC1 and the second sub-D/A capacitor array section SCAR2 of the second sub-D/A converting section SDAC2. For example, the CAR1, the SCAR1 and the SCAR2 are disposed in the order of the CAR1, the SCAR1 and the SCAR2 along the second direction DR2. Specifically, the CAR1 and the SCAR1 are disposed to be adjacent to each other, and the SCAR1 and the SCAR2 are also disposed to be adjacent to each other.

Further, the switch array section SAR1 is disposed on the side of the first direction DR1 of the capacitor array section CAR1. Similarly, the switch array sections SAR3, SAR2, SSAR1 and SSAR2 are disposed on the side of the first direction DR1 of the capacitor array sections CAR3, CAR2, SCAR1 and SCAR2, respectively.

According to the layout arrangement in FIG. 7, it is possible to efficiently perform the layout arrangement of the capacitor array section or the switch array section of the DAC, and to reduce the layout area of the DAC. That is, as shown in FIG. 6, it is possible to realize the layout arrangement of the capacitor array section and the switch array section which is optimal for the circuits which are symmetrically disposed around the node NC, and thus, it is possible to enhance the layout efficiency and to reduce the circuit area.

Further, according to the layout arrangement in FIG. 7, it is possible to efficiently wire the signal lines from the switch array sections SAR3, SAR2, SAR1, SSAR1, and SSAR2 to the capacitor array sections CAR3, CAR2, CAR1, SCAR1, and SCAR2, and thus, it is possible to reduce the influence of the wiring area of the signal lines to increase in the layout area, to thereby reduce the layout area.

Further, in the layout arrangement of FIG. 7, the capacitor array section CAR1 on the higher bit side in which the high capacitance ratio accuracy is required is disposed between the capacitor array sections CAR3 and CAR2 on the lower bit side in which the low capacitance ratio accuracy is required, and the capacitor arrays sections SCAR1 and SCAR2. Thus, different capacitors are layout-arranged around the capacitor array section CAR1, and thus, it is possible to suppress variation in the capacitance ratio accuracy of the capacitor array section CAR1 due to change in the manufacturing process.

3. DEM Method

Figure 8:
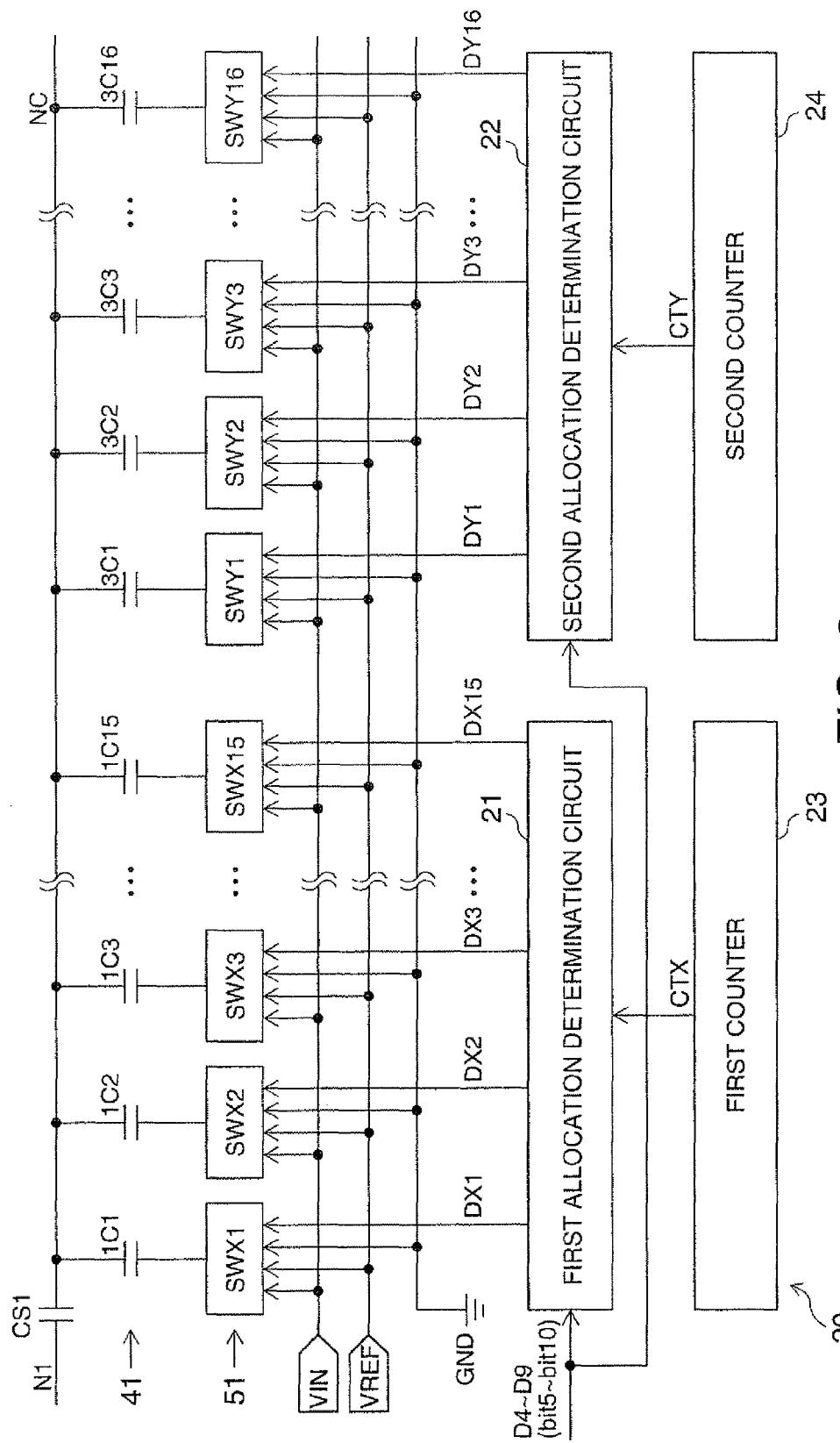
FIG. 8 is a diagram illustrating a detailed configuration example of a first capacitor array section, a first switch array section and a control section.

Next, the DEM (dynamic element matching) of the present embodiment will be described in detail. FIG. 8 shows a specific configuration example of the first capacitor array section 41, the first switch array section 51 and the control circuit 20 on the higher bit side in FIG. 2.

The capacitor array section 41 has first type capacitors 101 to 1C15 and second type capacitors 3C1 to 3C16. The second type capacitors 3C1 to 3C16 are different in capacitance value from the first type capacitors 1C1 to 1C15, which have three times (more broadly an integer number of times) the capacitance values of the first type capacitors 1C1 to 1C15, for example. Further, each one end of the first capacitors 1C1 to 1C15 and the second capacitors 3C1 to 3C16 is connected to the output node NC.

The switch array section 51 has switch elements SWX1 to SWX15 and SWY1 to SWY16. These switch elements SWX1 to SWX15 and SWY1 to SWY16 are connected to the other ends of the first type capacitors 1C1 to 1C15 and the second type capacitors 3C1 to 3C16. Further, the switch elements SWX1 to SWX15 and SWY1 to SWY16 are switch-controlled on the basis of signals DX1 to DX15 and DY1 to DY16 generated by D4 to D9 which are the higher bits (bit 5 to bit 10) of the input digital data.

Specifically, the switch elements SWX1 to SWX15 and SWY1 to SWY16 connect the other ends of the first type capacitors 1C1 to 1C15 and the second capacitors 3C1 to 3016 to the input signal VIN during the sampling period.

Further, the switch elements SWX1 to SWX15 and SWY1 to SWY16 connect the other ends of the first type capacitors 1C1 to 1C15 and the second capacitors 3C1 to 3C16 to VREF or GND during the successive approximation period (conversion period). For example, in a case where logic levels of the signals DX1 to DX15 and DY1 to DY16 are "1", the other ends of the first type capacitors 1C1 to 1C15 and the second capacitors 3C1 to 3C16 are connected to the reference voltage VREF, and in a case where the logic levels of the signals DX1 to DX15 and DY1 to DY16 are "0", the other ends of the first type capacitors 1C1 to 1C15 and the second capacitors 3C1 to 3C16 are connected to GND.

The control circuit 20 includes first and second allocation determination circuits 21 and 22, and first and second counters 23 and 24.

The first counter 23 performs a count process to output a first count value CTX to the first allocation determination circuit 21. The first allocation determination circuit 21 performs a process of determining allocation of the first type capacitors 1C1 to 1C15 to the respective bits (bit 5 to bit 10) of the input digital data D4 to D9, on the basis of the first count value CTX from the first counter 23.

The second counter 24 performs a count process to output a second count value CTY to the second allocation determination circuit 22. The second allocation determination circuit 22 performs a process of determining allocation of the second type capacitors 3C1 to 3C16 to the respective bits (bit 5 to bit 10) of the input digital data D4 to D9, on the basis of the second count value CTY from the second counter 24.

In this way, the first and second allocation determination circuits 21 and 22 perform the allocation determination process of the first type capacitors 1C1 to 1C15 and the second type capacitors 3C1 to 3C16 to the respective bits of the input digital data, to thereby realize DEM of the capacitors of the capacitor array section 41. The allocation determination process through the first and second allocation determination circuits 21 and 22 can be realized by a bit rotation process using the input digital data D4 to D9, for example.

When the total count number of the first counter is represented as a first total count number and the total count number of the second counter 24 is represented as a second total count number, the first and second counters 23 and 24 serve as counters in which the first and second total count values are different from each other. Specifically, the first and second counters 23 and 24 serve as counters in which the greatest common factor of the first and second total count values becomes 1. For example, the first total count number of the first counter 23 is 15, and the second total count number of the second counter 24 is 16. Here, the greatest common factor of the first total count number of 15 and the second total count number of 16 is 1. The first and second total count values are not limited to 15 and 16, and may be at least different total count values. Preferably, the first and second total count values may be total count values in which the greatest common factor is 1.

Next, the DEM method of the present embodiment will be described in detail with reference to FIGS. 9A to 10B. Hereinafter, the first type capacitors 1C1 to 1C15 are appropriately referred to as "1C", and the second type capacitors 3C1 to 3C16 are appropriately referred to as "3C".

FIG. 9A shows an example of allocation numbers of the first type capacitors 1C and the second capacitors 3C to the respective bits 5 to 10 of the input digital data. As described above, the capacitance values of the second type capacitors 3C become three times the capacitance values of the first type capacitors 1C.

For example, one first type capacitor 1C is allocated to bit 5 (D4) of the input digital data. Similarly, two and four first type capacitors 1C are allocated to bit 6 and bit 7 (D5 and D6), respectively. Thus, the capacitors CA1, CA2 and CA3 which are binary-weighted to be 1:2:4 (FIG. 2) are realized. That is, the capacitors CA1, CA2 and CA3 correspond to bits 5, 6 and 7 in FIG. 9A, which are realized by one, two and four first type capacitors 1C, respectively.

Two first type capacitors 1C and two second type capacitors 3C are allocated to bit 8 (D7) of the input digital data.

Similarly, four first type capacitors 1C and four second type capacitors 3C are allocated to bit 9 (D8), and two first type capacitors 1C and ten second type capacitors 3C are allocated to bit 10 (D9). Thus, the capacitors CA4, CA5 and CA6 which are binary-weighted to be 8:16:32 are realized. That is, the capacitors CA4, CA5 and CA6 correspond to bits 8, 9 and 10 in FIG. 9A, respectively, and the respective capacitors of CA4, CA5, and CA6 are realized by a pair of the first type capacitor 1C and the second type capacitor 3C such as 2 to 2, 4 to 4 and 2 to 10.

In FIG. 9A, a case where the second type capacitors 3C are capacitors having three times the capacitance values of the first type capacitors 1C is shown, but the present embodiment is not limited thereto. For example, in FIG. 9B, the second type capacitors 6C are capacitors having six times the capacitance values of the first type capacitors 1C. In FIG. 9B, an example of the allocation number of the first type capacitors 1C and the second type capacitors 6C to the respective bits 5 to 10 of the input digital data is shown. The capacitors CA1, CA2, CA3, CA4, CA5 and CA6 of the capacitor array section 41 which are binary-weighted to be 1:2:4:8:16:32 can be realized by the allocation in FIG. 9B.

FIG. 10A is a diagram illustrating an operation of the first allocation determination circuit 21 in FIG. 8. The first allocation determination circuit 21 generates signals DX1 to DX15 on the basis of a count value CTX from the first counter 23 which is sequentially incremented to be 0, 1, 2, . . . , 14, and outputs the result to the switch array section 51.

For example, in a case where the count value CTX is 0, the first type capacitor 1C1 in FIG. 8 is allocated to bit 5 (D4) of the input digital data by the signal DX1, as shown in FIG. 10A. Specifically, the switch element SWX1 which is controlled by the signal DX1 connects the other end of the first type capacitor 1C1 to the reference voltage VREF in a case where bit 5 of the input digital data is "1", and connects the other end of the first type capacitor 1C1 to GND in a case where bit 5 is "0".

Further, in a case where the count value CTX is 0, the first type capacitors 1C2 and 1C3 in FIG. 8 are allocated to bit 6 (D5) of the input digital data by the signals DX2 and DX3, as shown in FIG. 10A. Specifically, the switch elements SWX2 and SWX3 which are controlled by the signals DX2 and DX3 connect the other ends of the first type capacitors 1C2 and 1C3 to the reference voltage VREF in a case where bit 6 of the input digital data is "1", and connects the other ends of the first type capacitors 1C2 and 1C3 to GND in a case where bit 6 is "0".

Similarly, in a case where the count value CTX is 0, the first type capacitors 1C4 to 1C7, 1C8 to 1C9, 1C10 to 1C13, 1C14 to 1C15 are respectively allocated to bits 7, 8, 9 and 10 of the input digital data by the signals DX4 to DX7, DX8 to DX9, DX10 to DX13 and DX14 to DX15.

With such a configuration, the allocation of the first type capacitors 1C to the bits 5 to 10 is realized as shown in FIG. 9A.

Further, if the count value CTX is incremented, the allocation states of the first type capacitors 1C to the respective bits of the input digital data are changed. That is, as shown in FIG. 10A, whenever the count value CTX is incremented, the allocation states (signal states of DX1 to DX15) of the first type capacitors IC to the respective bits through DX1 to DX15 are sequentially shifted in the left direction, and thus, the allocation of the first type capacitors 1C to the respective bits of the input digital data is dynamically changed.

For example, in a case where the count value CTX is 1 as shown in FIG. 10A, the first type capacitors 1C1 and 1C2 are allocated to bit 6 of the input digital data by the signals DX1 and DX2. That is, in a case where the count value CTX is 0, the first type capacitor 1C1 is allocated to bit 5, but if the count value CTX is incremented by 1, the first type capacitor 1C1 is allocated to bit 6.

Further, in a case where the count value CTX is 1, the first type capacitors 1C3 to 1C6 are allocated to bit 7 of the input digital data by the signals DX3 to DX6. That is, in a case where the count value CTX is 0, the first type capacitor 1C3 is allocated to bit 6, but if the count value CTX is incremented by 1, the first type capacitor 1C3 is allocated to bit 7.

Further, if the count value CTX is incremented from 1 to 2, the first type capacitor 1C1 is allocated to bit 6 by the signal DX1, and the first type capacitors 1C2 to 1C5 are allocated to bit 7 by the signals DX2 to DX5. Accordingly, the allocation of the first capacitors 1C to the respective bits of the input digital data is dynamically changed, to thereby realize DEM. That is, since the first type capacitors 1C1 to 1C15 are equivalently used for bits 5 to 10 on the higher bit side of the input digital data, it is possible to enhance the apparent capacitance ratio accuracy.

FIG. 10B is a diagram illustrating an operation of the second allocation determination circuit 22 in FIG. 8. The second allocation determination circuit 22 generates signals DY1 to DY16 on the basis of a count value CTY from the second counter 24 which is sequentially incremented to be 0, 1, 2, . . . , 15, to output the result to the switch array section 51.

For example, in a case where the count value CTY is 0, the second type capacitors 3C1 and 3C2 are allocated to bit 8 of the input digital data by the signals DY1 and DY2. Specifically, the switch elements SWY1 and SWY2 which are controlled by the signals DY1 and DY2 connect the other ends of the second type capacitors 3C1 and 3C2 to the reference voltage VREF in a case where bit 8 of the input digital data is "1", and connect the other ends of the second type capacitors 3C1 and 3C2 to GND in a case where bit 8 is "0".

Further, in a case where the count value CTY is incremented, the allocation states of the second type capacitors 3C to the respective bits of the input digital data are changed. That is, as shown in FIG. 10B, whenever the count value CTX is incremented, the allocation states (signal states of DY1 to DY16) of the second type capacitors 3C to the respective bits through DY1 to DY16 are sequentially shifted in the left direction, and thus, the allocation of the second type capacitors 3C to the respective bits of the input digital data is dynamically changed.

For example, in a case where the count value CTY is 1 as shown in FIG. 10B, the second type capacitor 3C1 is allocated to bit 8 by the signal DY1, and the second type capacitors 3C2 to 3C5 are allocated to bit 9 by the signals DY2 to DY5. That is, in a case where the count value CTY is 0, the second type capacitor 3C2 is allocated to bit 8, but if the count value CTY is incremented by 1, the second type capacitor 3C2 is allocated to bit 9. Accordingly, the allocation of the second type capacitors 3C to the respective bits of the input digital data is dynamically changed, to thereby realize DEM.

Figure 11:
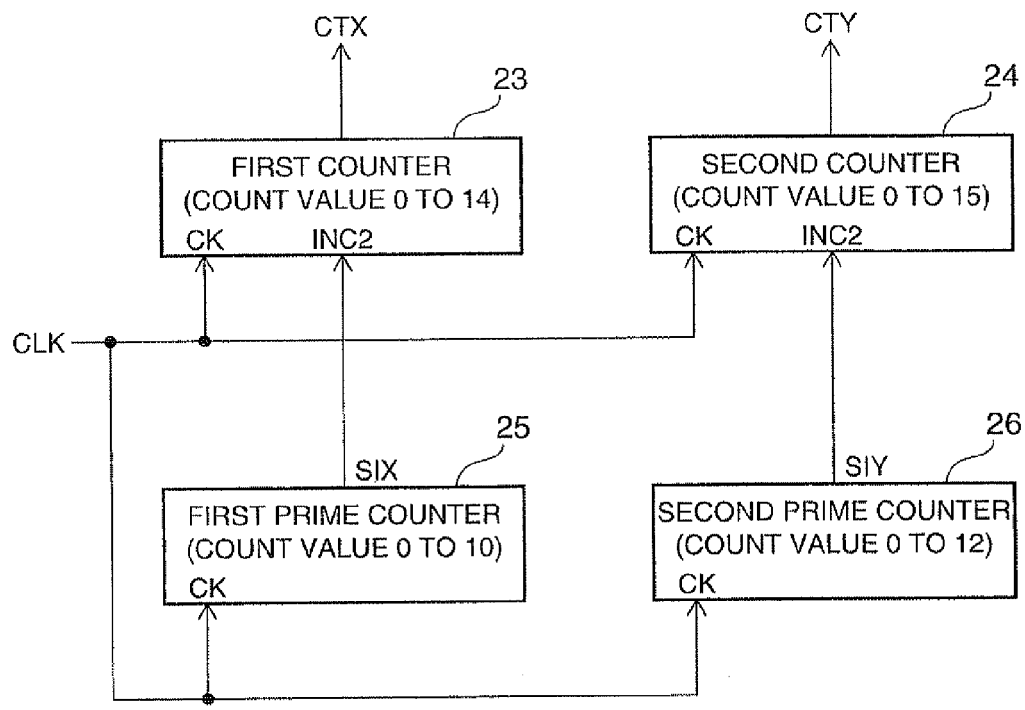
FIG. 11 is a diagram illustrating a method of changing count update states of first and second counters.

FIG. 11 shows a further detailed configuration example of the control circuit 20. In FIG. 11, first and second prime counters 25 and 26 are further provided corresponding to the first and second counters 23 and 24.

As shown in FIG. 11, the first counter 23 is a counter of which the total count number is 15, and the second counter 24 is a counter of which the total count number is 16. On the other hand, the first prime counter is a counter of which the total count number is 11 which is a prime number, and the second prime counter 26 is a counter of which the total count number is 13 which is a prime number. Further, in the first counter 23, the count update state is changed on the basis of an update signal SIX from the first prime counter 25.

For example, in FIG. 10A, the count value CTX of the first counter 23 is incremented by 1, in which the increment value is 1. On the other hand, if the update signal SIX from the first prime counter 25 becomes active (for example, logic level "1"), the increment value of the count value CTX is changed from 1 to 2, and thus, the first counter 23 is changed in its count update state. That is, since the total count value of the first prime counter 25 is I=11, in the first counter 23, its count update state is changed for each I=11 count. That is, in the first counter 23, the increment value (or decrement value) of the count value CTX is changed for each I=11 count.

Further, in FIG. 10B, the count value CTY of the second count value 24 is incremented by 1, in which the increment value is 1. On the other hand, if the update signal SIY from the second prime counter 26 becomes active, the increment value of the count value CTY is changed from 1 to 2, and thus, the second counter 24 is changed in its count update state. That is, since the total count value of the second prime counter 26 is J=13, its count update state is changed for each J=13 count, in the second counter 24. That is, in the second counter 24, the increment value (or decrement value) of the count value CTY is changed for each J=13 count.

Here, the total count numbers I and J of the prime counters 25 and 26 are different integers. It is preferable that I and J be set to different prime numbers. Thus, it is possible to increase randomness of the allocation pattern in DEM.

In FIG. 11, in order to change the count update state of the first counter 23 for each I (=11) count, and in order to change the count update state of the second counter 24 for each J (=13) count, the increment values (or decrement value) of the count values CTX and CTY of the first and second counters 23 and 24 are changed for each I and J count, but the present embodiment is not limited thereto. For example, as a method of changing the update state, such a variety of modifications are possible that the count values CTX and CTY of the first and second counters 23 and 24 are reset to 0 for each I and J count. Further, in FIG. 11, I is 11 and J is 13, but the present embodiment is not limited thereto. For example, it is sufficient if I and J are different integers, and it is preferable that I and J are different prime numbers.

Figure 12A:
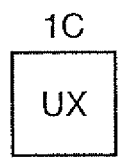
FIGS. 12A to 12C are diagrams illustrating examples of a first capacitor and a second capacitor which include a unit capacitor.
Figure 12B:
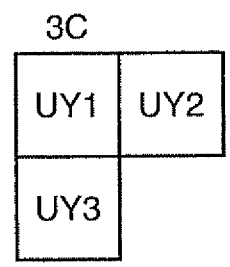
Figure 12C:
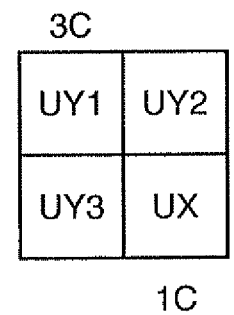

FIGS. 12A to 12C show configuration examples of the first type capacitor 1C and the second type capacitor 3C.

As shown in FIGS. 12A to 12C, the first type capacitor 1C includes a unit capacitor UX of M=1. On the other hand, as shown in FIG. 12B, the second type capacitor 3C includes unit capacitors UY1 to UY3 of N=3. Further, on a semiconductor chip, for example, the first type capacitor 1C and the second type capacitor 3C are layout-arranged as shown in FIG. 12C. In this way, if the first type capacitor IC and the second type capacitor 3C are configured by the unit capacitor pattern, it is possible to realize the first type capacitor and the second type capacitor having different capacitance values, while maintaining the capacitance ratio accuracy. For example, it is possible to set the capacitance ratios of the first type capacitor and the second type capacitor to an integral multiple.

The numbers M and N of the unit capacitors of the first type capacitor and the second type capacitor should be different integers, but are not limited to M=1 and N=3.

According to the above-described present embodiment, the switch control of DEM of dynamically changing the allocations of the first type capacitors 1C and the second type capacitors 3C to the respective bits of the input digital data is performed for the first switch array section 51 in FIG. 2. Thus, since the first type capacitors 1C and the second type capacitors 3C are equivalently used for all bits, for example, it is possible to enhance the apparent capacitance ratio accuracy of the capacitors in the first capacitor array section 41.

Further, as shown in FIG. 8, the first type capacitors 1C and the second type capacitors 3C having different capacitance values are disposed in the capacitor array section 41. Thus, for example, compared with a method of performing allocation of DEM using only the first type capacitors 1C, it is possible to increase the number of the allocation patterns of DEM to enhance the randomness, to thereby further enhance the DEM effects.

Figure 15:
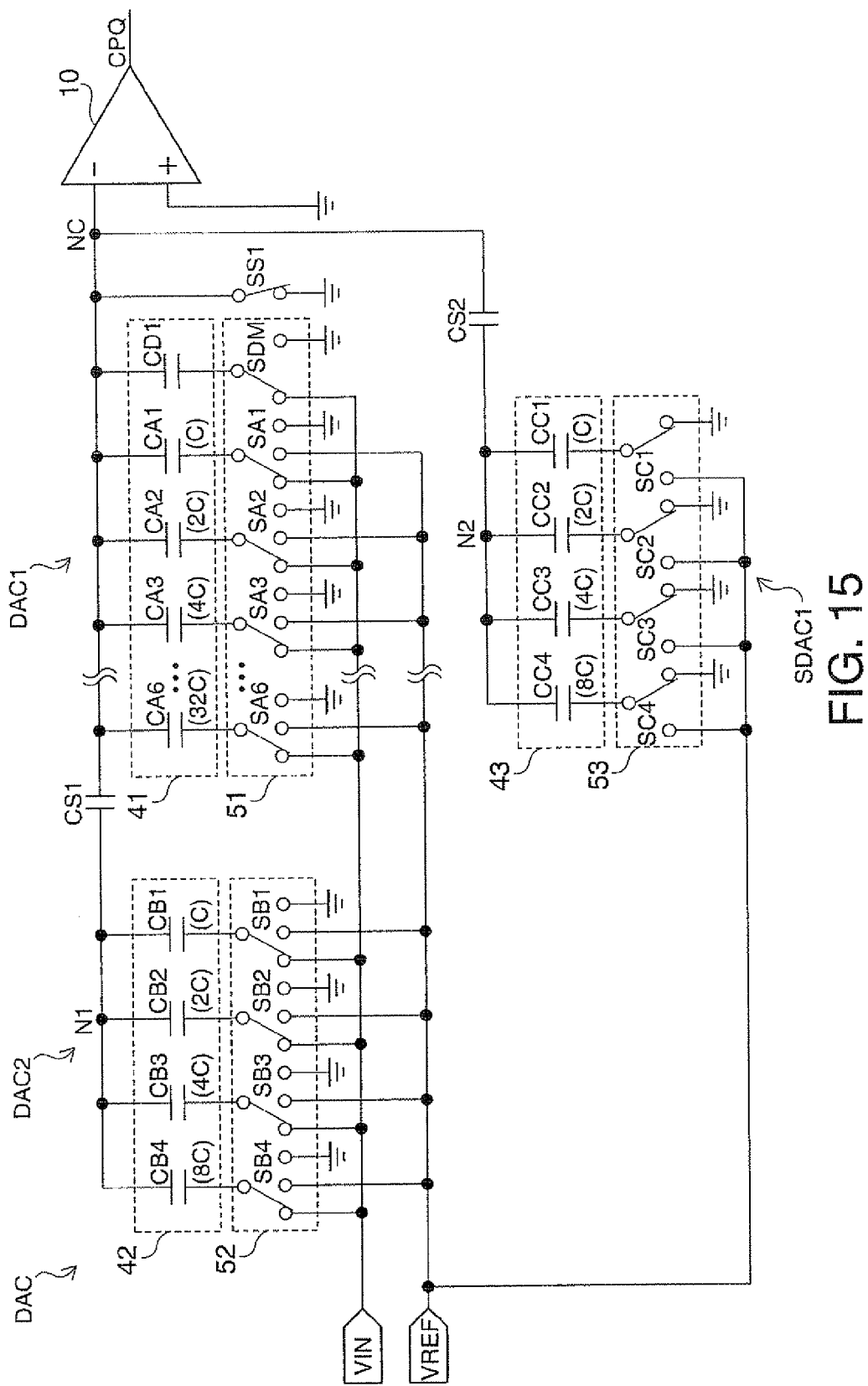
FIG. 15 is a diagram illustrating a detailed configuration example of a second configuration example of a D/A conversion circuit and an A/D conversion circuit including the D/A conversion circuit.

For example, in FIGS. 10A and 10B, 15 allocation patterns are set to the first type capacitors 1C and 16 allocation patterns are set to the second type capacitors 3C, in which the greatest common factor of 15 and 16 is 1. Accordingly, by the combination of the first type capacitors 1C and the second type capacitors 3C, it is possible to set 240 (=15×16) allocation patterns. Since the number of DEM allocation patterns is increased, it is possible to enhance the DEM effects. In this case, if the update states of the first and second counters 23 and are changed by disposing the first and second prime counters 25 and 26 as shown in FIG. 11, it is possible to further enhance the randomness in the allocation patterns, and to enhance the DEM effects. In particular, in a case where the A/D conversion is performed by oversampling, the randomness is smoothed by an averaging filter or the like which is connected with the rear stage of the A/D conversion circuit, to thereby make it possible to enhance the conversion accuracy.

Further, in a case where the capacitor array section 41 is configured only by the first type capacitors 1C, it is necessary to provide 63 first type capacitors 1C. Accordingly, it is necessary to provide 63 switch elements which are connected to the first type capacitors 1C, and thus, the layout area of the IC becomes large.

In this regard, if the capacitor array section 41 is configured by the first type capacitors 1C and the second type capacitors 3C having different capacitance values, for example, 31 (=15+16) switch elements SWX1 to SWX15 and SWY1 and SWY16 are enough, as shown in FIG. 8. Accordingly, compared with a case where the capacitor array section 41 is configured only by the first type capacitors 1C, it is possible to reduce the layout size of the IC.

4. Code Shift

Figure 13:
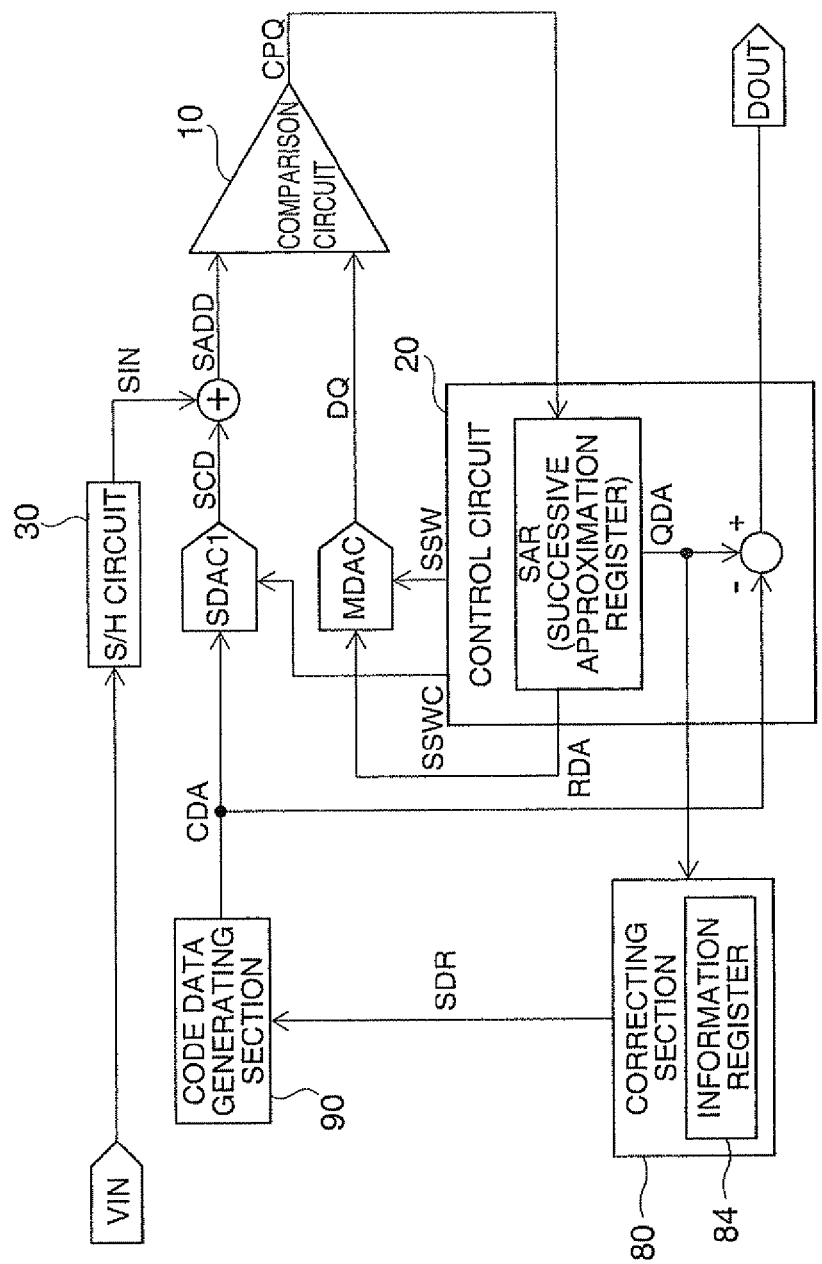
FIG. 13 is a diagram illustrating a configuration example of an A/D conversion circuit in a case where code shift is performed.

Next, a code shift method of the present embodiment will be described. FIG. 13 shows a configuration example of the A/D conversion circuit which is capable of realizing the code shift method. In FIG. 13, components of a first sub-D/A converting section SDAC1, a correcting section 80, and a code data generating section 90 are added to the configuration in FIG. 1.

The first sub-D/A converting section SDAC1 D/A-converts code data CDA. Further, the first sub-D/A converting section SDAC1 outputs a code signal SCD (signal obtained by D/A-converting CDA) corresponding to the code data CDA. Here, the code data CDA is time-varying data (digital data which varies every predetermined timing). Specifically, the code data CDA is data having a value which varies every A/D conversion timing or every plural A/D conversion timings within a predetermined data range.

In this case, the data range is a range in which first digital data is an upper limit value and second digital data is a lower limit value. The A/D conversion timing is, for example, a timing corresponding to each of A/D conversion periods in which digital data is converted into an analog signal.

The code data generating section 90 generates the code data CDA, and then outputs the code data CDA to the sub-D/A converting section SDAC1. For example, the code data generating section 90 outputs the code data CDA having the value which varies every A/D conversion timing or every plural A/D conversion timings within the predetermined data range. Specifically, the code data generating section 90 outputs the code data CDA having the value which varies every A/D conversion timing or every plural A/D conversion timings within a data range of lower bit data of successive approximation data.

The correcting section 80 performs a correction process. Specifically, the correcting section 80 performs the correction process for preventing a dynamic range from being reduced by the code shift using the code data CDA. The correcting section 80 has an information register 84.

Further, in FIG. 13, the comparison circuit 10 performs a process of comparing an addition signal SADD of the sampling signal SIN (signal obtained by sampling and holding VIN) of the input signal VIN and a code signal SCD with a D/A output signal DQ. Specifically, the comparison circuit 10 compares the addition signal SADD (added voltage) which is input to the first input terminal thereof with the D/A output signal DQ (D/A-converted voltage) which is input to the second input terminal thereof. For simplicity of description, in FIG. 13, the configuration example which is applied to the case other than the charge redistribution type is shown. However, in the case of the charge redistribution type, the comparison circuit 10 performs a process of comparing the sampling signal SIN with the addition signal of the D/A output signal DQ and the code signal SCD. For example, the comparison circuit 10 compares the sampling voltage of the signal SIN with the added voltage of the signals DQ and SCD.

Further, the control circuit 20 outputs the output data DOUT obtained on the basis of successive approximation data QDA (final data) from the successive approximation register SAR and the code data CDA as A/D conversion data of the input signal VIN. For example, in a case where the process of comparing the addition signal SADD of the sampling signal SIN and the code signal SCD with the D/A output signal DQ is performed, as shown in FIG. 13, the control circuit 20 performs a process of subtracting the code data CDA from the successive approximation result data QDA of the successive approximation register SAR. In the charge redistribution type, since the process of comparing the sampling signal SIN with the addition signal of the D/A output signal DQ and the code signal SCD is performed, the control circuit 20 performs a process of adding the code data CDA to the successive approximation result data QDA.

Further, the correcting section 80 performs a correction process of correcting (preventing) overflow of the successive approximation result data QDA due to the code shift using the code data CDA. Here, the code shift using the code data means that the successive approximation result data is shifted to a high electric potential side or a low electric potential side from the data corresponding to the input signal by performing the addition process of the sampling signal and the code signal of the input signal or the addition process of the D/A output signal and the code signal.

For example, the correcting section 80 performs the correction process by correcting the code data CDA. Further, the correcting section 80 outputs a correction indicating signal SDR to the code data generating section 90. Specifically, the correcting section 80 performs the correction process by correcting the code data CDA (current code data) on the basis of the previous successive approximation result data which is the successive approximation result data in the previous A/D conversion. This correction process is not limited to the process of correcting the code data CDA, and as long as the process can correct the overflow of the successive approximation result data QDA, a variety of modifications may be adopted. Further, the correction process may be performed by determining codes or the like of the code data CDA in addition to the previous successive approximation result data.

Further, in the present embodiment, the successive approximation operation is performed so that the voltage of the input signal VIN and the voltage of the D/A output signal DQ become equal, and thus, the final successive approximation result data QDA is obtained. Further, the data obtained by subtracting the code data CDA from the obtained successive approximation result data QDA is output as the data DOUT which is obtained by A/D converting the input signal VIN.

Figures 14A, 14B, 14C:
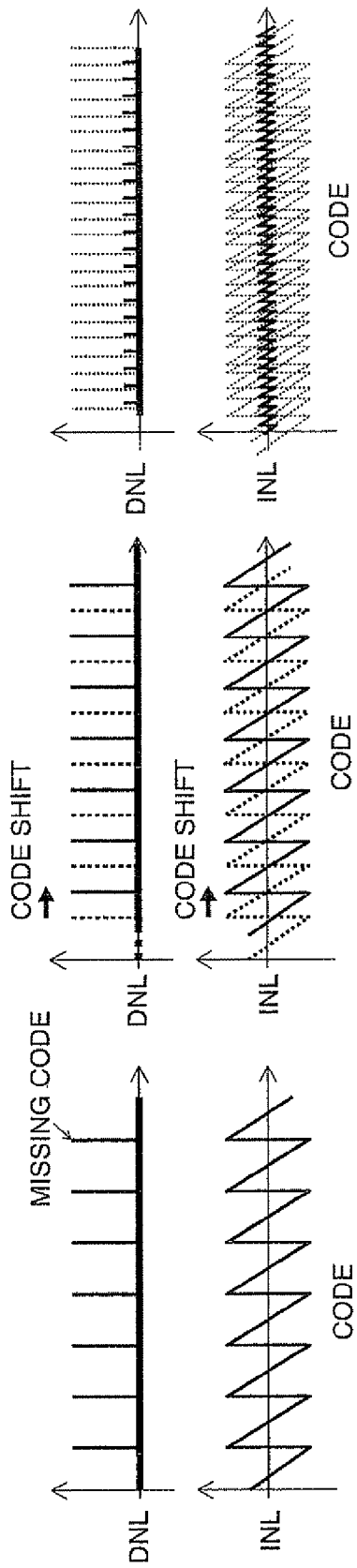
FIGS. 14A to 14C are diagrams illustrating a code shift method.

For example, in the A/D conversion circuit of the configuration in which the code shift is not performed as shown in FIG. 1, as shown in FIG. 14A, a missing code occurs at a specific code due to an error of DNL or the like. For example, if the DNL exceeds 1 LSB, a missing code phenomenon occurs that a code in which an output code is not present occurs.

In this regard, if the code shift method is used, even though such a missing code occurs, the signal SCD of the time-varying code data CDA is added to the sampling signal SIN, and thus, the code shift is performed as shown in FIG. 14B. Solid lines shown in FIG. 14B represent characteristics after the code shift, and broken lines represent characteristics before the code shift.

That is, in the code shift method, by setting the value of the code data CDA to a different value every A/D conversion timing or every plural A/D conversion timings, the position of the code at which the missing code occurs varies every A/D conversion timing or every plural A/D conversion timings, as shown in FIG. 14B. For example, even if the missing code occurs in the code of 00010000, the position thereof is shifted to the position of 00010001, 00010010, or 00001111. As a result, in view of a long period of time, the DNL and the INL are improved as shown in FIG. 14C, and thus, it is possible to obtain a superior characteristic of preventing the missing code phenomenon from occurring. In other words, deterioration in the DNL characteristic occurring in a specific code (the missing code) is dispersed to the peripheral codes by the time-varying code data CDA, thereby achieving the characteristic improvement.

FIG. 15 shows a detailed description in a case where the code shift method described with reference to FIG. 13 to FIG. 14C is performed. FIG. 15 is a detailed configuration example of the second configuration example in FIG. 4.

In FIG. 15, in addition to the configuration in FIG. 2, components of the second serial capacitor CS2 and the first sub-D/A converting section SDAC1 are added. The MDAC in FIG. 13 corresponds to the DAC1 and the DAC2 in FIG. 15.

The first sub-D/A converting section SDAC1 includes a first sub-D/A capacitor array section 43 and a first sub-D/A switch array section 53. The first sub-D/A capacitor array section 43 has a plurality of capacitors CC1 to CC4 of which each one end is connected to the second node N2. These capacitors CC1 to CC4 are binary-weighted to be 1:2:4:8. The first sub-D/A switch array section 53 has a plurality of switch elements SC1 to SC4 connected to the other ends of the plurality of capacitors CC1 to CC4 of the first sub-D/A capacitor array section 43.

The code data generating section 90 in FIG. 13 outputs the code data CDA to the first sub-D/A converting section SDAC1, and the switch elements SC1 to SC4 are switch-controlled on the basis of the code data CDA. For example, the code data generating section 90 outputs data having a value which varies every A/D conversion timing or every plural A/D conversion timings within a data range of lower bit data of the successive approximation data RDA (input digital data), as the code data CDA.

Specifically, in the case of the 8-bit A/D conversion, the code data generating section 90 changes the code data CDA within a data range of lower 4 bits of the successive approximation data RDA. For example, the code data generating section 90 changes the code data CDA in a random manner within the data range (or within a data range narrower than the data range of 0000 to 1111) of 0000 to 1111 to perform the switch control of the switch elements SC1 to SC4 of the switch array section 53 of the sub-D/A converting section SDAC1. Here, the switch elements SB1 to SB4 of the switch array section 52 of the D/A converting section DAC2 are also switch-controlled in accordance with the lower 4-bit data of the successive approximation data RDA. As described above, by setting the range in which the code data CDA is changed within the data range of the successive approximation data RDA for performing the switch control of the switch elements SB1 to SB4 of the DAC2, it is possible to effectively prevent the missing code from occurring.

It should be noted that the minimum resolution (a voltage corresponding to the LSB or a quantized voltage) of the D/A conversion circuit DAC is represented as RS1, and the minimum resolution of the sub-D/A conversion circuit SDAC1 is represented as RS2. In this case, RS2 is RS1 in FIG. 15. Specifically, for example, the capacitance values of the serial capacitors CS1 and CS2 are the same (approximately the same), and the capacitance value of the capacitor CB1 corresponding to the LSB of the DAC and the capacitance value of the capacitor CC1 corresponding to the LSB of the SDAC1 are also the same (substantially the same). That is, the sub-D/A conversing section SDAC1 outputs a code voltage higher than a noise voltage, instead of the noise voltage lower than the minimum resolution RS1 (LSB) of the D/A conversion circuit DAC. With such a configuration, it is possible to realize the code shift as shown in FIG. 14B. RS2=RS1 is not limiting, and RS2≥RS1 may be adopted.

FIG. 16A to FIG. 17B are simulation results illustrating effects of the DEM method and the code shift method according to the present embodiment. FIG. 16A shows a simulation result in a case where neither the DEM method or the code shift method are performed, and FIG. 16B shows a simulation result in a case where the DEM method is performed and the code shift method is not performed. FIG. 17A shows a simulation result in a case where the DEM method is not performed and the code shift method is performed, and FIG. 17B shows a simulation result in a case where the DEM method and the code shift are all performed.

As shown in the FFT result in FIG. 16B, by performing the DEM method, it is possible to remarkably reduce the harmonic component. On the other hand, the code shift method has a limited effect in reduction of the harmonic component. Further, as shown in the DNL and INL results in FIG. 17A, by performing the code shift method, it is possible to improve static characteristics such as DNL characteristics. In other words, it is possible to enhance the AC characteristics in the DEM method, and it is possible to enhance the static characteristics such as DNL characteristics in the code shift method. Accordingly, by performing the DEM method and the code shift method as shown in FIG. 17B, it is possible to improve the AC characteristics and the static characteristics.

5. Capacitor Layout Arrangement

Figure 18:
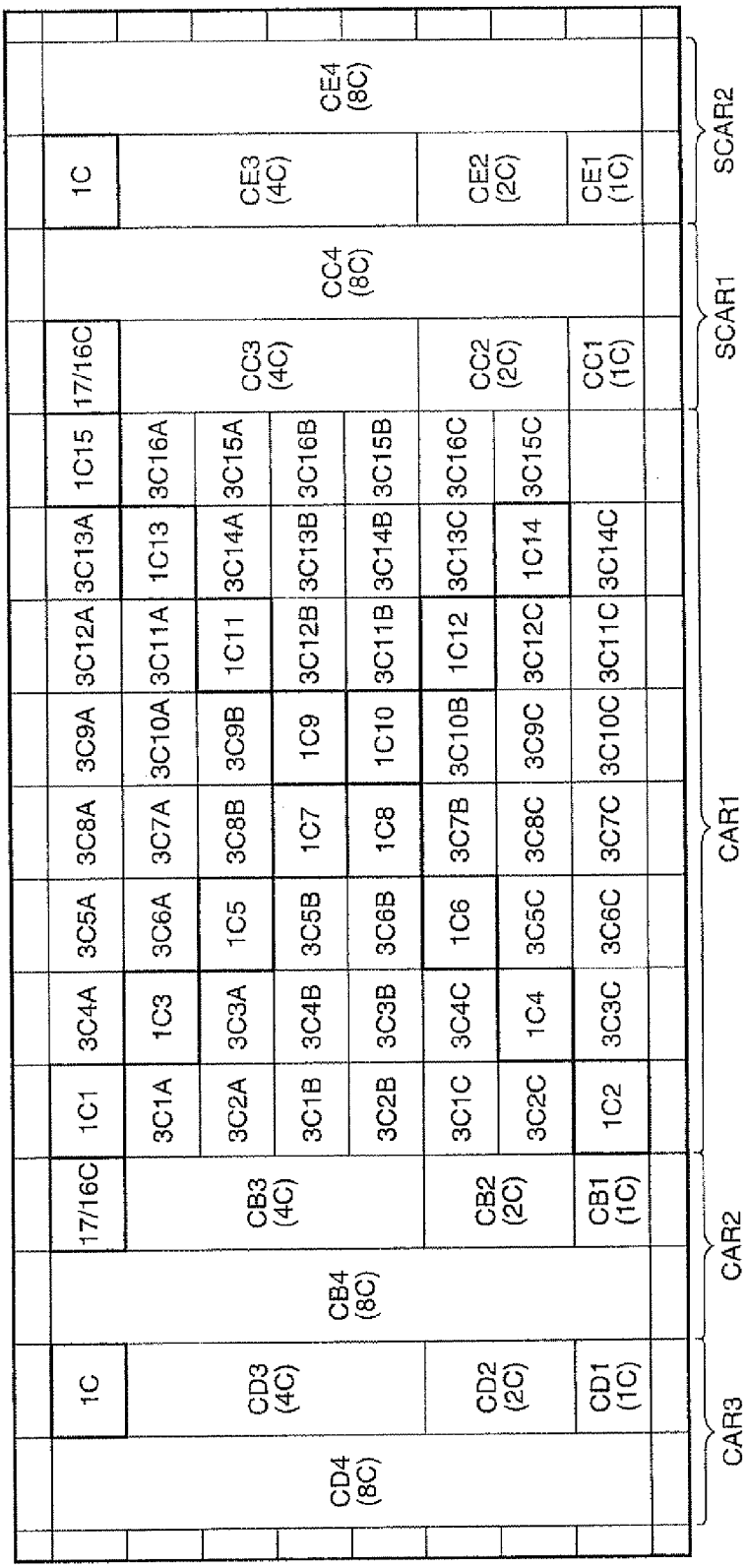
FIG. 18 is a diagram illustrating a detailed example of layout arrangement of a capacitor array region and a switch array region.

FIG. 18 is a diagram illustrating a detailed example of the layout arrangement of the capacitors of the capacitor array section. FIG. 18 shows a detailed layout arrangement example of the capacitor array sections CAR1, CAR2, CAR3, SCAR1 and SCAR2 of the DAC1, DAC2, DAC3, SDAC1 and SDAC2 in FIG. 6.

As shown in FIG. 18, the capacitor array section CAR1 of the DAC1 is disposed between the capacitor array sections CAR2 and CAR3 of the DAC2 and DAC3, and the capacitor array sections SCAR1 and SCAR2 of the SDAC1 and SDAC2. Further, a dummy capacitor is also disposed around the capacitor array sections CAR1, CAR2, CAR3, SCAR1 and SCAR2. Thus, a different capacitor is necessarily present around the capacitor array section CAR1 in which the switching control of DEM is performed, and thus, it is possible to enhance the capacitance ratio accuracy of the capacitors of the capacitor array section CAR1.

Further, in FIG. 18, 1C1 to 1C15 which are layout-arranged in the capacitor array section CAR1 are unit capacitors which form the first type capacitors 1C1 to 1C15 in FIG. 8. Here, for ease of description, the unit capacitors which form the first type capacitors 1C1 to 1C15 are represented by the same reference numerals 1C1 to 1C15.

Further, 3C1A to 3C1C, 3C2A to 3C2C, 3C3A to 3C3C, . . . , 3C16A to 3C16C which are layout-arranged in the capacitor array section CAR1 in FIG. 18 are unit capacitors which form the second type capacitors 3C1, 3C2, 3C3, . . . , 3C16 in FIG. 8, respectively. For example, the second type capacitor 3C1 in FIG. 8 includes three unit capacitors 3C1A, 3C1B and 3C1C in FIG. 18. Further, the second type capacitor 3C2 includes three unit capacitors 3C2A, 3C2B and 3C2C. This is similarly applied to the second type capacitors 3C3 to 3C16.

As described above, in FIG. 18, the plurality of unit capacitors which form the first type capacitors and the second type capacitors are arranged in a matrix form.

Further, in FIG. 18, the row arrangement position of the unit capacitor which forms the first type capacitor in an i-th (i is an integer) column in the matrix-formed arrangement is different from the row arrangement position of the unit capacitor which forms the first type capacitor in an (i+1)-th column in the matrix-formed arrangement.

For example, in the first column in the matrix-formed arrangement in FIG. 18, the unit capacitors 1C1 and 1C2 which form the first type capacitor are disposed in the first row and the eighth row. On the other hand, in the second column in the matrix-formed arrangement, the unit capacitors 1C3 and 1C4 which form the first type capacitor are disposed in the second row and the seventh row. That is, in the first column (i-th column in a broad sense) and the second column ((i+1)-th column in a broad sense), the row arrangement positions of the unit capacitors which form the first type capacitor are different from each other.

Similarly, in the third column in the matrix arrangement, the unit capacitors 1C5 and 1C6 which form the first type capacitor are disposed in the third row and the sixth row. On the other hand, in the fourth column in the matrix arrangement, the unit capacitors 1C7 and 1C8 which form the first type capacitor are disposed in the fourth row and the fifth row. That is, in the third column (i-th column in a broad sense) and the fourth column ((i+1)-th column in a broad sense), the row arrangement positions of the unit capacitors which form the first type capacitor are different from each other.

Further, in FIG. 18, the row arrangement position of the unit capacitor which forms the second type capacitor in the i-th column in the matrix-formed arrangement is different from the row arrangement position of the unit capacitor which forms the second type capacitor in the (i+1)-th column in the matrix-formed arrangement.

For example, in the first column in the matrix arrangement in FIG. 18, the unit capacitors 3C1A, 3C1B and 3C1C which form the second type capacitor are disposed in the second row, the fourth row and the sixth row, and the unit capacitors 3C2A, 3C2B and 3C2C are disposed in the third row, the fifth row and the seventh row. On the other hand, in the second column in the matrix arrangement, the unit capacitors 3C3A, 3C3B and 3C3C which form the second type capacitor are disposed in the third row, the fifth row and the eighth row, and the unit capacitors 3C4A, 3C4B and 3C4C are disposed in the first row, the fourth row and the sixth row. That is, in the first column (i-th column) and the second column ((i+1)-th column), the row arrangement positions (row arrangement position patterns) of the unit capacitors which form the second type capacitor are different from each other.

Similarly, in the third column in the matrix arrangement, the unit capacitors 3C5A, 3C5B and 3C5C which form the second type capacitor are disposed in the first row, the fourth row and the seventh row, and the unit capacitors 3C6A, 3C6B and 3C6C are disposed in the second row, the fifth row and the eighth row. On the other hand, in the fourth column in the matrix arrangement, the unit capacitors 3C7A, 3C7B and 3C7C which form the second type capacitor are disposed in the second row, the sixth row and the eighth row, and the unit capacitors 3C8A, 3C8B and 3C8C are disposed in the first row, the third row and the seventh row. That is, in the third column (i-th column) and the fourth column ((i+1)-th column), the row arrangement positions (row arrangement position patterns) of the unit capacitors which form the second type capacitor are different from each other.

If the unit capacitors which form the first type capacitors and the second type capacitors are dispersed and are layout-arranged in this way, it is possible to reduce the influence of position dependency of variation in the capacitance value.

That is, in a case where the capacitor is formed in the semiconductor manufacturing process, there is a high possibility that the capacitance value of the capacitor has position dependency. For example, there is a possibility that the capacitance value of the unit capacitor becomes small on the upper left side of the capacitor array section CAR1 in FIG. 18, and becomes large on the lower right side thereof. In this way, if the variation in the capacitance value has position dependency, variation in the capacitance ratio accuracy may occur.

In this regard, in FIG. 18, in the i-th column and the (i+1)-th column, the row arrangement positions of the unit capacitors which form the first type capacitor or the second type capacitor are different from each other. Accordingly, even in a case where the variation in the capacitance value has position dependency, it is possible to disperse the variation in a random manner. As a result, it is possible to reduce the variation in the capacitance ratio accuracy, and it is possible to minimally suppress the variation in the capacitance ratio accuracy in combination with the effect due to the switch control of DEM.

6. Full Differential Type

Figure 19:
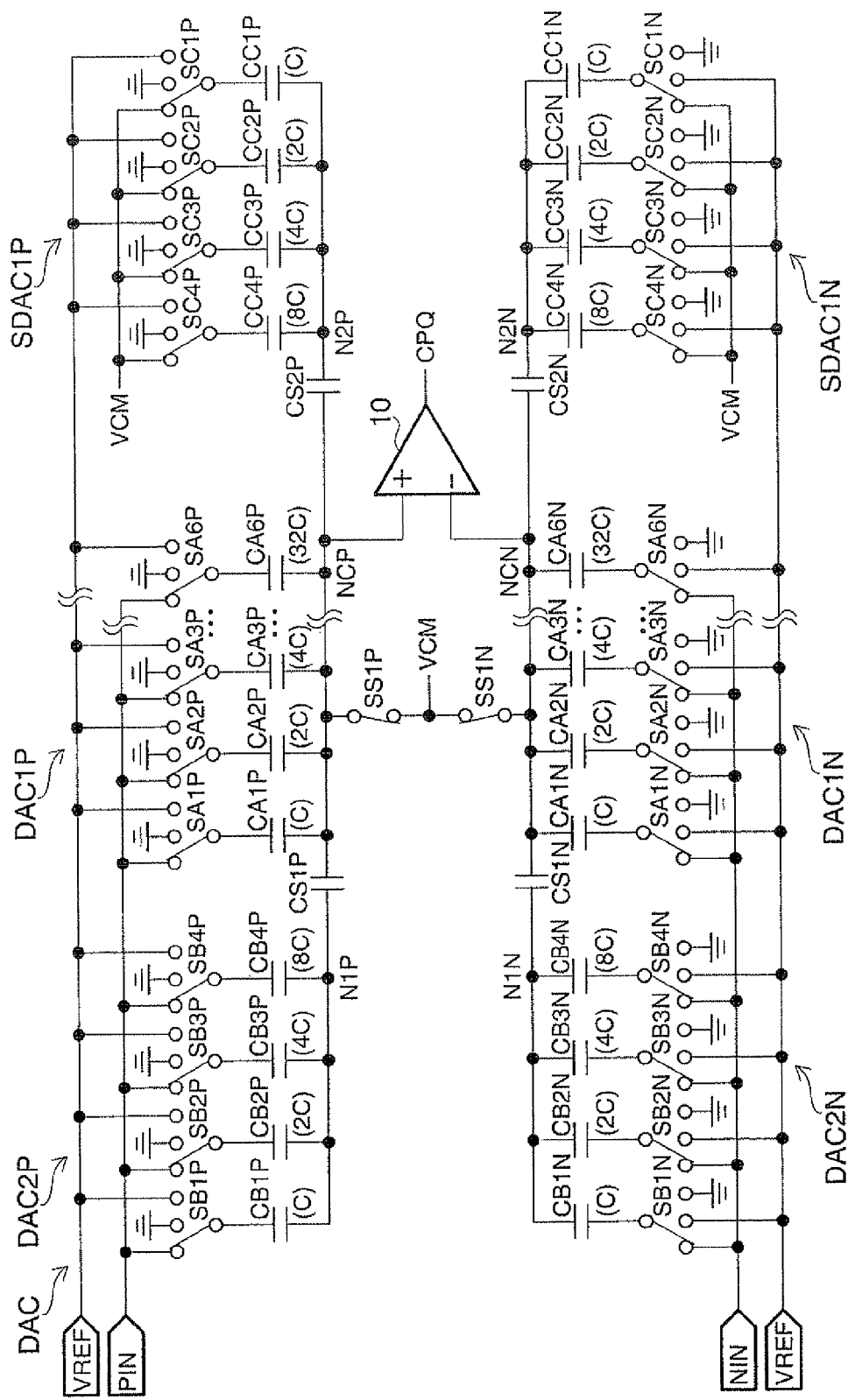
FIG. 19 is a diagram illustrating a configuration example of a full differential D/A conversion circuit and an A/D conversion circuit including the full differential D/A conversion circuit.

FIG. 19 is a diagram illustrating a configuration example of a full differential D/A conversion circuit and an A/D conversion circuit including the full differential. D/A conversion circuit according to the present embodiment. The configuration example in FIG. 19 includes a comparison circuit 10, main D/A converting sections DAC1P and DAC2P which are connected to a non-inverting input terminal of the comparison circuit 10, and main D/A converting sections DAC1N and DAC2N which are connected to an inverting input terminal thereof. Further, the configuration example thereof includes a code shift sub-D/A converting section SDAC1P which is connected to the non-inverting input terminal of the comparison circuit 10 and a code shift sub-D/A converting section SDAC1N which is connected to the inverting input terminal thereof.

The configuration of the non-inverting (positive) main DAC1P and DAC2P and the inverting (negative) main DAC1N and DAC2N includes the capacitor array section and the switch array section, in a similar way to the main DAC1 and DAC2 in FIG. 15. Further, a non-inverting (positive) input signal PIN which forms a differential signal is input to the DAC1P and DAC2P, and an inverting (negative) input signal NIN which forms the differential signal is input to the DAC1N and DAC2N.

Further, during the sampling period, a node NCP of the DAC1P is set to a common voltage (intermediate voltage) VCM by a switch element SS1P. Further, a node NCN of the DAC1N is set to a common voltage VCM by a switch element SS1N.

Further, during the sampling period, each one end of switch elements SA1P to SA6P of the DAC1P and switch elements SB1P to SB4P of the DAC2P is connected to the non-inverting signal PIN of the differential signal. Further, each one end of switch elements SA1N to SA6N of the DAC1N and switch elements SB1N to SB4N of the DAC2N is connected to the inverting signal NTN of the differential signal.

On the other hand, during the successive approximation period, each one end of the switch elements SA1P to SA6P of the DAC1P and the switch elements SB1P to SB4P of the DAC2P is connected to VREF in a case where a bit corresponding to the successive approximation data is "1", and is connected to GND in a case where the bit is "0".

On the other hand, each one end of the switch elements SA1N to SA6N of the DAC1N and the switch elements SB1N to SB4N of the DAC2N is connected to GND in a case where the bit corresponding to the successive approximation data is "1", and is connected to VREF in a case where the bit is "0".

The non-inverting code shift sub-D/A converting section SDAC1P and the inverting code shift sub-D/A converting section SDAC1N include the capacitor array section and the switch array section, in a similar way to the code shift SDAC1 in FIG. 15.

Further, during the sampling period, each one end of switch elements SC1P to SC4P of the SDAC1P and switch elements SC1N to SC4N of the SDAC1N is connected to VCM.

On the other hand, during the successive approximation period, each one end of the switch elements SC1P to SC4P of the SDAC1P is connected to VREF in a case where a bit corresponding to the code data is "1", and is connected to GND in a case where the bit is "0". On the other hand, each one end of the switch elements SC1N to SC4N of the SDAC1N is connected to GND in a case where the bit corresponding to the code data is "1", and is connected to VREF in a case where the bit is "0".

In such a full differential configuration in FIG. 19, as the capacitor array section, a non-inverting capacitor array section (CA1P to CA6P and the like) having the plurality of capacitors of which each one end is connected to the non-inverting output node (NCP) is disposed. Further, an inverting capacitor array section (CA1N to CA6N and the like) having the plurality of capacitors of which each one end thereof is connected to the inverting output node (NCN) is disposed. Further, as the switch array section, a non-inverting switch array section (SA1P to SA6P and the like) having the plurality of switch elements which are connected to the other ends of the plurality of capacitors of the non-inverting capacitor array section and are switch-controlled according to input digital data is disposed. Further, an inverting switch array section (SA1N to SA6N and the like) having the plurality of switch elements which are connected to the other ends of the plurality of capacitors of the inverting capacitor array section and are switch-controlled according to the input digital data is disposed.

Further, in the above described full differential configuration, the control circuit 20 performs the switch control of dynamically changing the allocation of the capacitors (first type capacitor and second type capacitor) to the respective bits of the input digital data for the non-inverting switch array section (SA1P to SA6P and the like) and the inverting switch array section (SA1N to SA6N and the like).

Further, specifically, in the full differential configuration, the control circuit 20 performs the switch control so that the allocation of the capacitors (first type capacitor and the second type capacitor) to the respective bits of the input digital data becomes a first allocation pattern, for the non-inverting switch array section. Further, the control circuit 20 performs the switch control so that the allocation of the capacitors (first type capacitor and the second type capacitor) to the respective bits of the input digital data becomes a second allocation pattern which is different from the first allocation pattern, for the inverting switch array section.

Figure 20:
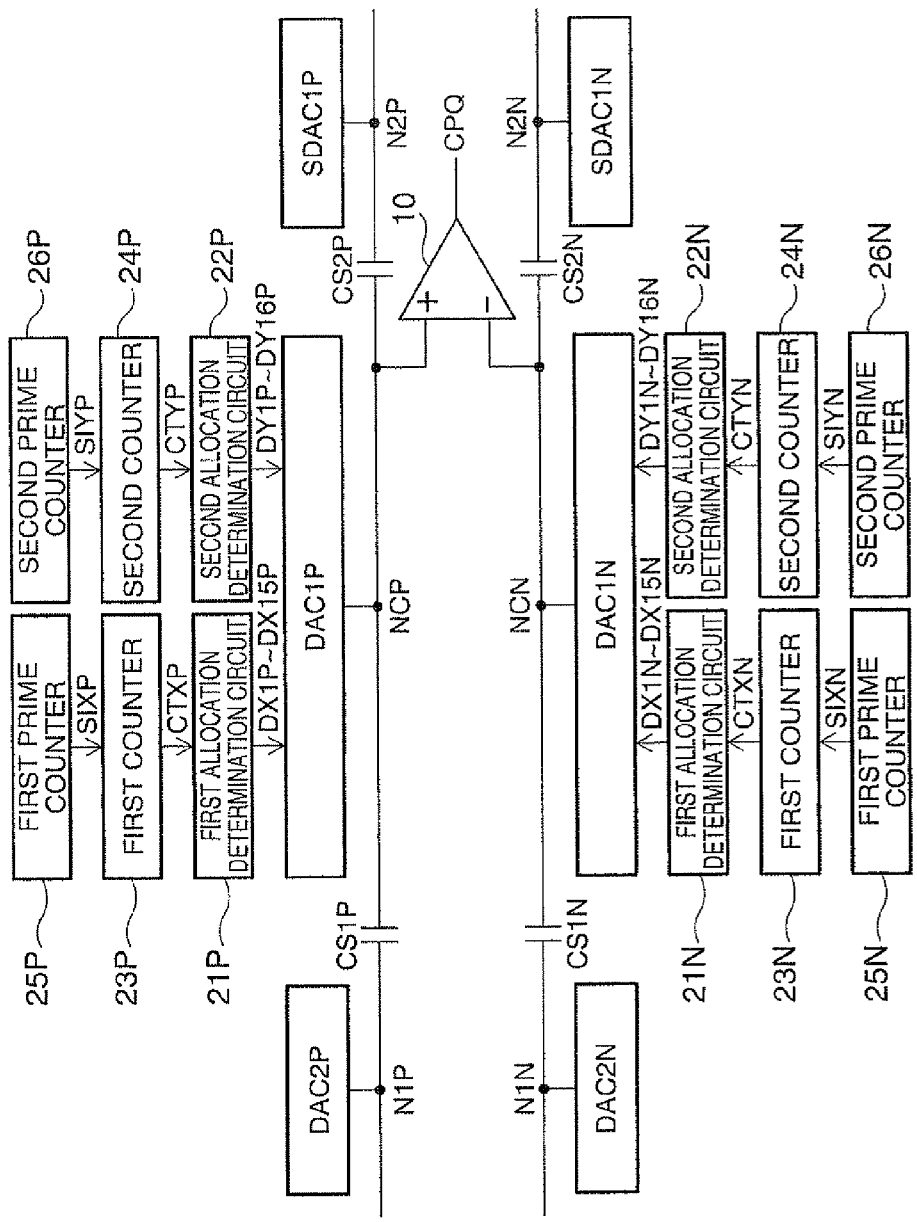
FIG. 20 is a diagram illustrating a configuration example in a case where the full differential D/A conversion circuit is used in the second configuration example.

For example, FIG. 20 is a diagram illustrating a configuration example in a case where the control circuit in the full differential type is used. In FIG. 20, first and second allocation determination circuits 21P and 22P, first and second counters 23P and 24P, and first and second prime counters 25P and 26P, which are on the non-inverting side, are disposed.

Further, the first and second prime counters 25P and 26P output non-inverting updating signals SIXP and SIYP to the first and second counters 23P and 24P. Further, the first and second counters 23P and 24P output non-inverting count values CTXP and CTYP to the first and second allocation determination circuits 21P and 22P. Further, the first and second allocation determination circuits 21P and 22P output non-inverting allocation signals DX1P to DX15P and DY1P to DY16P to the D/A converting section DAC1P on the higher bit side.

Further, in FIG. 20, first and second allocation determination circuits 21N and 22N, first and second counters 23N and 24N, and first and second prime counters 25N and 26N, which are on the inverting side, are disposed.

Further, the first and second prime counters 25N and 26N output inverting updating signals SIXN and SIYN to the first and second counters 23N and 24N. Further, the first and second counters 23N and 24N output inverting count values CTXN and CTYN to the first and second allocation determination circuits 21N and 22N. Further, the first and second allocation determination circuits 21N and 22N output inverting allocation signals DX1N to DX15N and DY1N to DY16N to the D/A converting section DAC1N on the higher bit.

As described above, by independently disposing the allocation determination circuits, the counters, and the prime counters on the non-inverting side and the inverting side, it is possible to independently perform the switch control of DEM on the non-inverting side and the inverting side. Thus, it is possible to perform the switch control so that the allocation of the first type capacitor and the second type capacitor to the respective bits of the input digital data becomes the first allocation pattern, on the non-inverting side, and to perform the switch control so that the allocation of the first type capacitor and the second type capacitor to the respective bits of the input digital data becomes the second allocation pattern which is different from the first allocation pattern, on the inverting side.

For example, on the non-inverting side, the switch control of DEM is performed by the first allocation pattern as shown in FIGS. 10A and 10B. On the other hand, on the inverting side, the switch control of DEM is performed by the second allocation pattern which is different from the first allocation pattern as shown in FIGS. 10A and 10B. For example, this can be realized by differentiating the total count number of the first and second prime counters 25P and 26P on the non-inverting side and the total count number of the first and second prime counters 25N and 26N on the inverting side, in FIG. 20. Alternatively, this can be realized by differentiating the total count number of the first and second counters 23P and 24P on the non-inverting side and the total count number of the first and second counters 23N and 24N on the inverting side.

With such a configuration, since the allocation patterns are differentiated on the non-inverting side and the inverting side, it is possible to enhance the randomness and to further enhance the effects of DEM.

Figure 21:
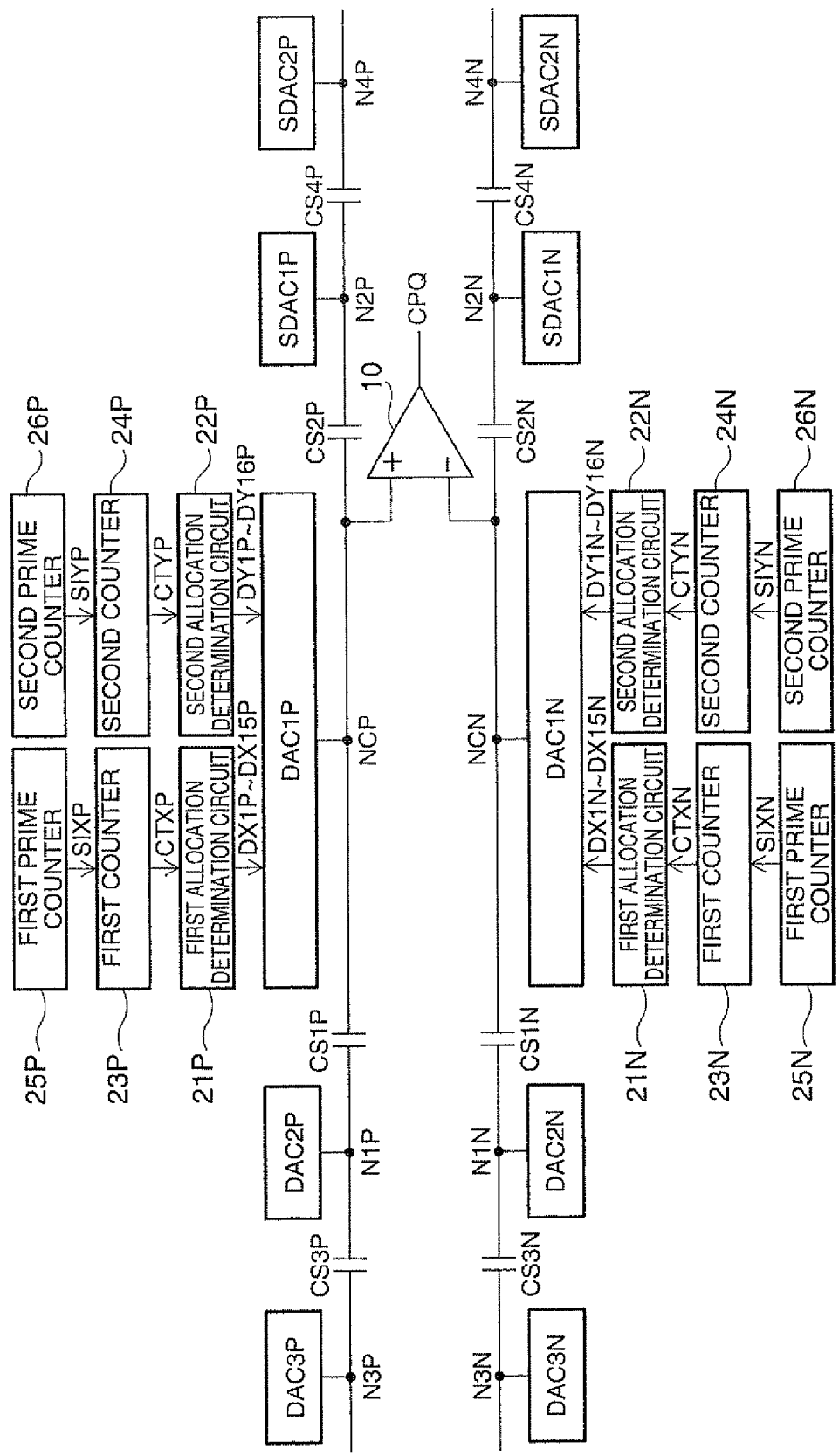
FIG. 21 is a diagram illustrating a configuration example in a case where the full differential D/A conversion circuit is used in the third configuration example.

FIG. 21 is a diagram illustrating a configuration example in a case where the full differential D/A conversion circuit is used in the third configuration example in FIG. 6. In FIG. 21, components of serial capacitors CS3P, CS3N, CS4P and CS4N, third D/A converting sections DAC3P and DAC3N, and second sub-D/A converting sections SDAC2P and SDAC2N are added to the configuration in FIG. 20.

The serial capacitor CS3P is disposed between a node NIP and a node N3P, and the serial capacitor CS3N is disposed between a node N1N and a node N3N. The serial capacitor CS4P is disposed between a node N2P and a node N4P, and the serial capacitor CS4N is disposed between a node N2N and a node N4N.

Further, the third non-inverting D/A converting section DAC3P is connected to the node N3P, and the third inverting D/A converting section DAC3N is connected to the node N3N. Further, the second non-inverting sub-D/A converting section SDAC2P is connected to the node N4P, and the second inverting sub-D/A converting section SDAC2N is connected to the node N4N.

FIG. 22 is a diagram illustrating an example of a layout arrangement of the capacitor array region and the switch array region in a case where the full differential D/A conversion circuit is used in the third configuration example.

In FIG. 22, the layout arrangement of inverting capacitor array sections CAR3N, CAR2N, CAR1N, SCAR1N and SCAR2N, inverting switch array sections SAR1N, SAR1N, SAR1N, SSAR1N, and SSAR2N is the same as the layout arrangement of the capacitor array sections CAR3, CAR2, CAR1, SCAR1, and SCAR2 and the switch array sections SAR3, SAR2, SAR1, SSAR1 and SSAR2 in FIG. 7.

Further, for example, it is assumed that the axis along the second direction DR2 is a symmetric axis in the arrangement region of the circuit such as a comparison circuit CP. In this case, in FIG. 22, the respective non-inverting capacitor array sections CAR3P, CAR2P, CAR1P, SCAR1P and SCAR2P are layout-arranged in positions which are linearly symmetric to the symmetric axis with respect to the respective inverting capacitor array sections CAR3N, CAR2N, CAR1N, SCAR1N and SCAR2N. Similarly, the respective non-inverting switch array sections SAR3P, SAR2P, SAR1P, SSAR1P and SSAR2P are layout-arranged in positions which are linearly symmetric to the symmetric axis with respect to the respective inverting switch array sections SAR3N, SAR2N, SAR1N, SSAR1N and SSAR2N.

By performing such a linear-symmetric layout arrangement, it is possible to enhance the layout efficiency and to reduce the layout area. Further, if the linear-symmetric layout arrangement as shown in FIG. 22 is employed in the full differential circuit, it is possible to provide a non-inverting circuit characteristic and an inverting circuit characteristic, thereby optimizing the circuit characteristics in a case where the full differential type is used.

7. Electronic Apparatus

FIG. 23 is a diagram illustrating a configuration example of an electric apparatus including the A/D conversion circuit (D/A conversion circuit) of the present embodiment. The electronic apparatus includes a sensor 510, a detection circuit 520, an A/D conversion circuit 530 (D/A conversion circuit), and a processing section 540. A variety of modifications is possible such that a part of the components are omitted or a different component is added. For example, the detection circuit 520, the A/D conversion circuit 530, and the processing section 540 may be realized by an integrated circuit device.

As the electronic apparatus in FIG. 23, for example, a variety of devices such as a bioinstrumentation device (pulsometer, passometer or the like), a personal digital assistant, a video device (digital camera, video camera) or a time piece may be used.

The sensor 510 is a gyro-sensor, an acceleration sensor, a photosensor, a pressure sensor or the like, and a variety of sensors may be used according to use of the electronic apparatus. The detection circuit 520 amplifies a sensor signal which is output from the sensor 510 to extract a desired signal. Further, the A/D conversion circuit 530 converts the detected signal (desired signal) from the detection circuit 520 into digital data, and outputs the data to the processing section 540.

The processing section 540 performs a necessary digital signal processing for the digital data from the A/D conversion circuit 530. Further, the processing section 540 may perform a gain control of the detection circuit 520, for example. Here, as the digital signal processing performed by the processing section 540, a variety of processes such as a fast Fourier transform for extracting an appropriate desired signal from the sensor signal may be used.

Hereinbefore, the present embodiment has been described, but those skilled in the art will easily understand that a variety of modifications can be made within a range without substantially departing from the new matters and effects of the invention. Thus, such modifications are all covered by the scope of the invention. For example, any term used at least once together with a different term having a broader or equivalent meaning in the description or drawings may be replaced with the different term in any location of the description or drawings. Further, any combination of the present embodiment and modifications is covered by the scope of the invention. Further, the configurations or operations of the D/A conversion circuit, the A/D conversion circuit and the electronic apparatus, or the D/A conversion method, the A/D conversion method, the DEM method, the code shift method and the like are not limited to those described in the present embodiment, and a variety of modifications thereof may be adopted.

The entire content of Japanese Patent Application No. 2011-036019 (date of filing: Feb. 22, 2011) is incorporated in this specification by reference.

What is claimed is:

1. A D/A conversion circuit comprising:
   a first D/A converting section which is connected with an output node;
   a first serial capacitor which is disposed between the output node and a first node;
   a second D/A converting section which is connected with the first node; and
   a control circuit which performs a switch control,
   wherein the first D/A converting section includes a first capacitor array section including a plurality of capacitors of which each one end is connected with the output node, and a first switch array section including a plurality of switch elements which are connected with the other ends of the plurality of capacitors of the first capacitor array section and are switch-controlled according to higher bits of input digital data,
   wherein the second D/A converting section includes a second capacitor array section including a plurality of capacitors of which each one end is connected with the first node, and a second switch array section including a plurality of switch elements which are connected with the other ends of the plurality of capacitors of the second capacitor array section and are switch-controlled according to lower bits of the input digital data, and
   wherein the control circuit performs the switch control for dynamically changing allocation of the capacitors to the respective bits of the input digital data, for the first switch array section of the first D/A converting section,
   the D/A conversion circuit further comprising:
   a second serial capacitor which is disposed between the output node and a second node; and
   a first sub-D/A converting section which is connected with the second node,
   wherein the first sub-D/A converting section includes a first sub-D/A capacitor array section including a plurality of capacitors of which each one end is connected with the second node, and a first sub-D/A switch array section including a plurality of switch elements which is connected with the other ends of the plurality of capacitors of the first sub-D/A capacitor array section.

2. The D/A conversion circuit according to claim 1, wherein when a direction which directs to the first switch array section from the first capacitor array section is represented as a first direction and a direction which is perpendicular to the first direction is represented as a second direction, the second capacitor array section of the second D/A converting section, the first capacitor array section of the first D/A converting section and the first sub-D/A capacitor array section of the first sub-D/A converting section are disposed along the second direction in an order of the second capacitor array section, the first capacitor array section and the first sub-D/A capacitor array section.

3. The D/A conversion circuit according to claim 1, further comprising:
   a third serial capacitor which is disposed between the first node and a third node;
   a third D/A converting section which is connected with the third node;
   a fourth serial capacitor which is disposed between the second node and a fourth node; and
   a second sub-D/A converting section which is connected with the fourth node,
   wherein the third D/A converting section includes a third capacitor array section including a plurality of capacitors of which each one end is connected with the third node, and a third switch array section including a plurality of switch elements which are connected with the other ends of the plurality of capacitors of the third capacitor array section, and
   wherein the second sub-D/A converting section includes a second sub-D/A capacitor array section including a plurality of capacitors of which each one end is connected with the fourth node, and a second sub-D/A switch array section including a plurality of switch elements which are connected with the other ends of the plurality of capacitors of the second sub-D/A capacitor array section.

4. The D/A conversion circuit according to claim 3,
wherein the second capacitor array section of the second D/A converting section is disposed between the third capacitor array section of the third D/A converting section and the first capacitor array section of the first D/A converting section, and
wherein the first sub-D/A capacitor array section of the first sub-D/A converting section is disposed between the first capacitor array section of the first D/A converting section and the second sub-D/A capacitor array section of the second sub-D/A converting section.

5. A D/A conversion circuit comprising:
a first D/A converting section which is connected with an output node;
a first serial capacitor which is disposed between the output node and a first node;
a second D/A converting section which is connected with the first node; and
a control circuit which performs a switch control,
wherein the first D/A converting section includes a first capacitor array section including a plurality of capacitors of which each one end is connected with the output node, and a first switch array section including a plurality of switch elements which are connected with the other ends of the plurality of capacitors of the first capacitor array section and are switch-controlled according to higher bits of input digital data,
wherein the second D/A converting section includes a second capacitor array section including a plurality of capacitors of which each one end is connected with the first node, and a second switch array section including a plurality of switch elements which are connected with the other ends of the plurality of capacitors of the second capacitor array section and are switch-controlled according to lower bits of the input digital data,
wherein the control circuit performs the switch control for dynamically changing allocation of the capacitors to the respective bits of the input digital data, for the first switch array section of the first D/A converting section,
wherein the first capacitor array section includes a first type capacitor and a second type capacitor which is different in capacitance value from the first type capacitor as a plurality of capacitors, and
wherein the control circuit performs the switch control for dynamically changing allocation of the first type capacitor and the second type capacitor to the respective bits of the input digital data, for the first switch array section.

6. The D/A conversion circuit according to claim 5,
wherein the control circuit includes:
a first counter;
a second counter;
a first allocation determination circuit which determines allocation of the first type capacitor to each bit of the input digital data on the basis of a first count value from the first counter; and
a second allocation determination circuit which determines allocation of the second type capacitor to each bit of the input digital data on the basis of a second count value from the second counter.

7. The D/A conversion circuit according to claim 5,
wherein the first type capacitor includes M unit capacitors, and
wherein the second type capacitor includes N (integer which is different from M) unit capacitors.

8. The D/A conversion circuit according to claim 5,
wherein the plurality of unit capacitors which form the first type capacitor and the second type capacitor is disposed in a matrix form,
wherein the row arrangement position of the unit capacitor which forms the first type capacitor in an i-th (i is a natural number) column in the matrix-formed arrangement is different from the row arrangement position of the unit capacitor which forms the first type capacitor in an (i+1)-th column in the matrix-formed arrangement, and
wherein the row arrangement position of the unit capacitor which forms the second type capacitor in the i-th column in the matrix-formed arrangement is different from the row arrangement position of the unit capacitor which forms the second type capacitor in the (i+1)-th column in the matrix-formed arrangement.

9. A D/A conversion circuit comprising:
a first D/A converting section which is connected with an output node;
a first serial capacitor which is disposed between the output node and a first node;
a second D/A converting section which is connected with the first node; and
a control circuit which performs a switch control,
wherein the first D/A converting section includes a first capacitor array section including a plurality of capacitors of which each one end is connected with the output node, and a first switch array section including a plurality of switch elements which are connected with the other ends of the plurality of capacitors of the first capacitor array section and are switch-controlled according to higher bits of input digital data,
wherein the second D/A converting section includes a second capacitor array section including a plurality of capacitors of which each one end is connected with the first node, and a second switch array section including a plurality of switch elements which are connected with the other ends of the plurality of capacitors of the second capacitor array section and are switch-controlled according to lower bits of the input digital data,
wherein the control circuit performs the switch control for dynamically changing allocation of the capacitors to the respective bits of the input digital data, for the first switch array section of the first D/A converting section,
wherein the first capacitor array section includes a first non-inverting capacitor array section including a plurality of capacitors of which each one end is connected with the output node on a non-inverting side, and a first inverting capacitor array section including a plurality of capacitors of which each one end is connected with the output node on an inverting side,
wherein the first switch array section includes a first non-inverting switch array section including a plurality of switch elements which are connected with the other ends of the plurality of capacitors of the first non-inverting capacitor array section and is switch-controlled according to the higher bits of the input digital data, and a first inverting switch array section including a plurality of switch elements which are connected with the other ends of the plurality of capacitors of the first inverting capacitor array section and are switch-controlled according to the higher bits of the input digital data, wherein the second capacitor array section includes a second non-inverting capacitor array section including a plurality of capacitors of which each one end is connected with the first node on the non-inverting side, and a second inverting capacitor array section including a plurality of capacitors of which each one end is connected with the first node on the inverting side, and wherein the second switch array section includes a second non-inverting switch array section including a plurality of switch elements which are connected with the other ends of the plurality of capacitors of the second non-inverting capacitor array section and are switch-controlled according to the lower bits of the input digital data, and a second inverting switch array section including a plurality of switch elements which are connected with the other ends of the plurality of capacitors of the second inverting capacitor array section and are switch-controlled according to the lower bits of the input digital data.

10. An A/D conversion circuit comprising:
the D/A conversion circuit according to claim 9; and
a comparison circuit which performs a comparison process for a signal of the output node of the D/A conversion circuit and a sampled signal of an input signal.

11. An electronic apparatus comprising the D/A conversion circuit according to claim 9.

12. An electronic apparatus comprising the A/D conversion circuit according to claim 10.

13. An A/D conversion circuit comprising:
the D/A conversion circuit according to claim 1; and
a comparison circuit which performs a comparison process for a signal of the output node of the D/A conversion circuit and a sampled signal of an input signal.

14. An electronic apparatus comprising the D/A conversion circuit according to claim 1.

15. An electronic apparatus comprising the A/D conversion circuit according to claim 13.

16. An A/D conversion circuit comprising:
the D/A conversion circuit according to claim 5; and
a comparison circuit which performs a comparison process for a signal of the output node of the D/A conversion circuit and a sampled signal of an input signal.

17. An electronic apparatus comprising the D/A conversion circuit according to claim 5.

18. An electronic apparatus comprising the A/D conversion circuit according to claim 16.

* * * * *